United States Patent
Cheng et al.

(10) Patent No.: US 11,735,618 B2
(45) Date of Patent: Aug. 22, 2023

(54) STACKED GRID DESIGN FOR IMPROVED OPTICAL PERFORMANCE AND ISOLATION

(71) Applicant: Taiwan Semiconductor Manufacturing Company, Ltd., Hsin-Chu (TW)

(72) Inventors: Yun-Wei Cheng, Taipei (TW); Horng-Huei Tseng, Hsin-Chu (TW); Chao-Hsiung Wang, Hsin-Chu (TW); Chun-Hao Chou, Tainan (TW); Tsung-Han Tsai, Zhunan Township (TW); Kuo-Cheng Lee, Tainan (TW); Tzu-Hsuan Hsu, Kaohsiung (TW); Yung-Lung Hsu, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 145 days.

(21) Appl. No.: 17/401,382

(22) Filed: Aug. 13, 2021

(65) Prior Publication Data
US 2021/0384233 A1 Dec. 9, 2021

Related U.S. Application Data

(63) Continuation of application No. 16/559,922, filed on Sep. 4, 2019, now Pat. No. 11,121,168, which is a
(Continued)

(51) Int. Cl.
*H01L 27/146* (2006.01)

(52) U.S. Cl.
CPC .... *H01L 27/1464* (2013.01); *H01L 27/14621* (2013.01); *H01L 27/14623* (2013.01);
(Continued)

(58) Field of Classification Search
CPC ......... H01L 27/14612; H01L 27/14621; H01L 27/14623; H01L 27/14627; H01L 27/14629; H01L 27/1464; H01L 27/14685
See application file for complete search history.

(56) References Cited

U.S. PATENT DOCUMENTS 7,138,618 B2  11/2006 Mishina et al.
8,530,266 B1  9/2013 Chen et al.
(Continued)

FOREIGN PATENT DOCUMENTS

WO  2012128076 A1  9/2012

OTHER PUBLICATIONS

U.S. Appl. No. 14/688,084, filed Apr. 16, 2015.
(Continued)

*Primary Examiner* — Nelson Garces
(74) *Attorney, Agent, or Firm* — Eschweiler & Potashnik, LLC

(57) ABSTRACT

A back side illumination (BSI) image sensor with a dielectric grid opening having a planar lower surface is provided. A pixel sensor is arranged within a semiconductor substrate. A metallic grid is arranged over the pixel sensor and defines a sidewall of a metallic grid opening. A dielectric grid is arranged over the metallic grid and defines a sidewall of the dielectric grid opening. A capping layer is arranged over the metallic grid, and defines the planar lower surface of the dielectric grid opening.

20 Claims, 14 Drawing Sheets

Related U.S. Application Data continuation of application No. 15/996,636, filed on Jun. 4, 2018, now Pat. No. 11,004,886, which is a continuation of application No. 14/713,172, filed on May 15, 2015, now Pat. No. 9,991,307, which is a continuation-in-part of application No. 14/688,084, filed on Apr. 16, 2015, now Pat. No. 9,570,493.

(52) U.S. Cl.
CPC .. *H01L 27/14629* (2013.01); *H01L 27/14685* (2013.01); *H01L 27/14627* (2013.01)

(56) References Cited

U.S. PATENT DOCUMENTS

| | | |
|---|---|---|
| 8,766,386 B2 | 7/2014 | Tsuji |
| 8,803,067 B2 | 8/2014 | Mizuta et al. |
| 8,816,358 B1 | 8/2014 | Tsai et al. |
| 9,570,493 B2 | 2/2017 | Cheng et al. |
| 2001/0026322 A1 | 10/2001 | Takahashi et al. |
| 2008/0116537 A1 | 5/2008 | Adkisson et al. |
| 2010/0181634 A1 | 7/2010 | Wang et al. |
| 2011/0108938 A1 | 5/2011 | Nozaki et al. |
| 2012/0147208 A1 | 6/2012 | Otsuka |
| 2012/0168835 A1 | 7/2012 | Adkisson et al. |
| 2012/0267743 A1 | 10/2012 | Nakamura et al. |
| 2012/0268631 A1* | 10/2012 | Takase ............ G02B 3/0068 257/E31.127 |
| 2012/0273906 A1 | 11/2012 | Mackey et al. |
| 2013/0134536 A1 | 5/2013 | Mori et al. |
| 2014/0061842 A1 | 3/2014 | Ting et al. |
| 2014/0339606 A1* | 11/2014 | Lin ................ H01L 27/14621 438/70 |
| 2014/0339615 A1 | 11/2014 | Wang et al. |
| 2015/0015752 A1 | 1/2015 | Numata |
| 2015/0048467 A1 | 2/2015 | Weng et al. |
| 2015/0070552 A1* | 3/2015 | Lin ................ H01L 27/14627 348/307 |
| 2015/0087104 A1 | 3/2015 | Tseng et al. |
| 2015/0171125 A1 | 6/2015 | Jangjian et al. |
| 2015/0270298 A1 | 9/2015 | Lin et al. |
| 2016/0033688 A1 | 2/2016 | Wu et al. |

OTHER PUBLICATIONS

U.S. Appl. No. 14/688,094, filed Apr. 16, 2015.
EMD Performance Materials. Anti Reflective Coatings. Feb. 5, 2015. Retrieved from http://www.emd-performance-materials.com/en/electronic_materials/glossary/anti_reflective_coatings_glossary/anti_reflective_coatings_glossary.html.
U.S. Appl. No. 14/688,106, filed Apr. 16, 2015.
Non Final Office Action dated Mar. 15, 2016 U.S. Appl. No. 14/688,106.
Non Final Office Action dated Mar. 22, 2016 U.S. Appl. No. 14/688,084.
Final Office Action dated Jun. 29, 2016 for U.S. Appl. No. 14/688,084.
Final Office Action dated Aug. 10, 2016 U.S. Appl. No. 14/688,106.
Non Final Office Action dated Aug. 18, 2016 U.S. Appl. No. 14/688,094.
Notice of Allowance dated Sep. 28, 2016 U.S. Appl. No. 14/688,084.
Final Office Action dated Dec. 30, 2016 U.S. Appl. No. 14/688,094.
Non-Final Office Action dated Mar. 22, 2017 for U.S. Appl. No. 14/688,106.
Final Office Action dated May 8, 2018 for U.S. Appl. No. 14/688,094.
Non-Final Office Action dated Apr. 12, 2016 for U.S. Appl. No. 14/713,172.
Final Office Action dated Oct. 28, 2016 for U.S. Appl. No. 14/713,172.
Non-Final Office Action dated Sep. 11, 2017 for U.S. Appl. No. 14/713,172.
Notice of Allowance dated Jan. 26, 2018 for U.S. Appl. No. 14/713,172.
Non-Final Office Action dated Oct. 3, 2018 in connection with U.S. Appl. No. 14/688,094.
Non-Final Office Action dated Nov. 14, 2018 in connection with U.S. Appl. No. 15/996,636.
Non-Final Office Action dated May 29, 2019 in connection with U.S. Appl. No. 15/996,636.
Final Office Action dated Oct. 29, 2019 in connection with U.S. Appl. No. 15/996,636.
Non-Final Office Action dated Jan. 22, 2021 for U.S. Appl. No. 16/559,922.
Notice of Allowance dated May 10, 2021 for U.S. Appl. No. 16/559,922.

* cited by examiner

STACKED GRID DESIGN FOR IMPROVED OPTICAL PERFORMANCE AND ISOLATION

REFERENCE TO RELATED APPLICATIONS

This Application is a Continuation of U.S. application Ser. No. 16/559,922, filed on Sep. 4, 2019, which is a Continuation of U.S. application Ser. No. 15/996,636, filed on Jun. 4, 2018 (now U.S. Pat. No. 11,004,886, issued on May 11, 2021), which is a Continuation of U.S. application Ser. No. 14/713,172, filed on May 15, 2015 (now U.S. Pat. No. 9,991,307, issued on Jun. 5, 2018), which is a Continuation-in-Part of U.S. application Ser. No. 14/688,084, filed on Apr. 16, 2015 (now U.S. Pat. No. 9,570,493, issued on Feb. 14, 2017). The contents of the above-referenced Patent Applications are hereby incorporated by reference in their entirety.

BACKGROUND

Many modern day electronic devices comprise optical imaging devices (e.g., digital cameras) that use image sensors. Image sensors convert optical images to digital data that may represent the images. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) image sensor. BSI image sensor fabrication can be integrated into conventional semiconductor processes for low cost, small size, and high through-put. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
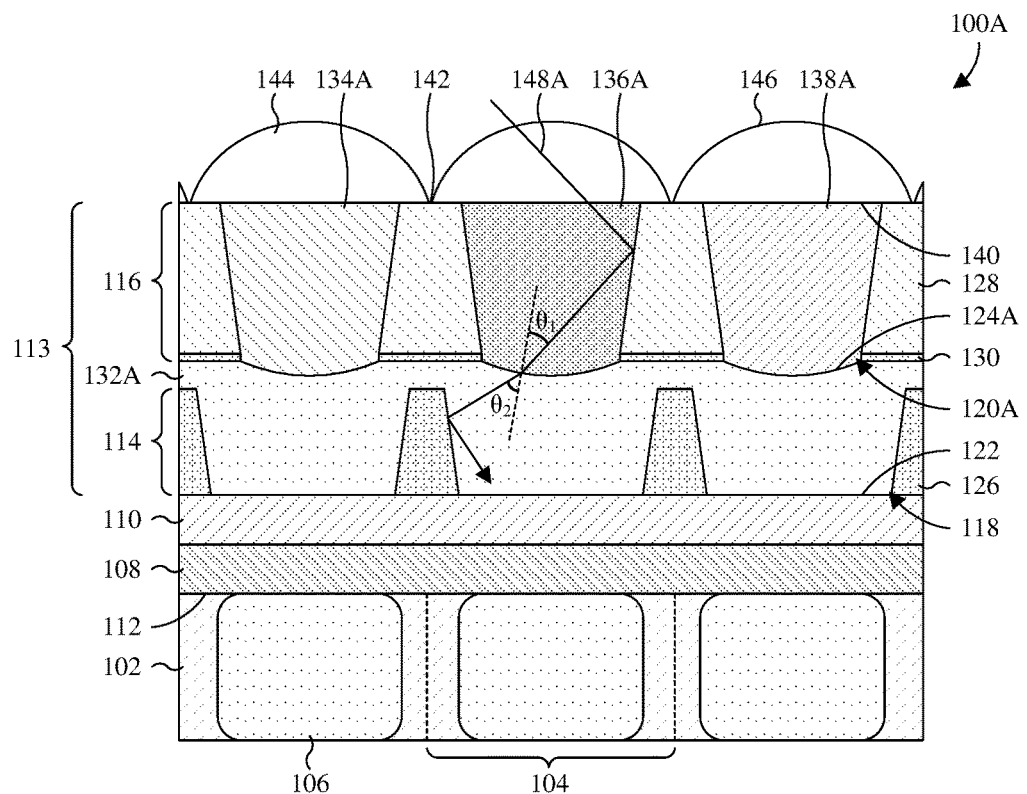
FIG. 1A illustrates a cross-sectional view of some embodiments of a back-side illuminated (BSI) image sensor having color filters with concave lower surfaces.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Back side illumination (BSI) image sensors typically include pixels sensors arranged within a semiconductor substrate of an integrated circuit. The pixel sensors are arranged between a back side of the integrated circuit and a back-end-of-line (BEOL) metallization stack of the integrated circuit. Micro-lenses and color filters corresponding to the pixel sensors are stacked on the back side of the integrated circuit over the corresponding pixel sensors. The color filters are configured to selectively transmit assigned wavelengths of radiation to the corresponding pixel sensors, and the micro-lenses are configured to focus incident radiation (e.g., photons) onto the color filters.

A stacked grid is typically arranged on the back side of the integrated circuit. The stacked grid includes a metallic grid and a dielectric grid overlying the metallic grid. The metallic grid is laterally arranged around metallic grid openings corresponding to the pixel sensors. The metallic grid openings are filled by a capping layer that vertically spaces the dielectric grid from the metallic grid. The dielectric grid is laterally arranged around dielectric grid openings corresponding to the pixel sensors and having planar lower surfaces. The dielectric grid openings are filled with the color filters. The dielectric grid is configured to guide or otherwise focus radiation entering the color filters towards the pixel sensors by total internal reflection. However, after reaching the planar lower surfaces of the dielectric grid openings, the radiation may diverge (e.g., by refraction). Such divergence may increase crosstalk between neighboring pixel sensors and reduce optical performance. Further, the stacked grid calls for a careful control of design parameters to achieve suitable optical performance and isolation.

In view of the foregoing, the present disclosure is directed to a BSI image sensor that has a dielectric grid opening with a curved lower surface for focusing radiation, as well as a method for manufacturing the BSI image sensor. In some embodiments, the BSI image sensor includes a pixel sensor arranged within a semiconductor substrate. A metallic grid is arranged over the semiconductor substrate, and a dielectric grid is arranged over the metallic grid. The metallic grid and the dielectric grid respectively define sidewalls for a metallic grid opening and a dielectric grid opening overlying the pixel sensor. A capping layer is arranged between the metallic and the dielectric grids, and fills the metallic grid opening. Further, the capping layer defines a curved lower surface of the dielectric grid opening. A color filter is arranged in the dielectric grid opening, and a micro lens is arranged over the color filter. The color filter has a refractive index differing from that of the capping layer.

The different refractive indexes of the color filter and the capping layer, and the curved lower surface of the dielectric grid opening, focus radiation entering the color filter and impinging on the curved lower surface towards the pixel sensor. In a sense, the curved lower surface acts as a lens. By focusing radiation towards the pixel sensor, crosstalk between neighboring pixel sensors is reduced and optical performance is improved. Further, the curved lower surface can advantageously be achieved without additional processing steps through etching process tuning.

Further, the present disclosure is directed to a BSI image sensor that has carefully controlled design parameters for improved optical performance and isolation. In some embodiments, the BSI image sensor includes a pixel sensor arranged within a semiconductor substrate. A metallic grid is arranged over the semiconductor substrate, and a dielectric grid is arranged over the metallic grid. A ratio of a dielectric grid height to a metallic grid height may be, for example, between about 1.0 to about 8.0. Further, an angle between a lower surface of the dielectric grid and a sidewall of the dielectric grid may be, for example, about 60 degrees to about 90 degrees. In some embodiments, the angle between the lower surface of the dielectric grid and the sidewall of the dielectric grid may be, for example, less than about 90 degrees. The metallic grid and the dielectric grid respectively define sidewalls for a metallic grid opening and a dielectric grid opening overlying the pixel sensor. At least one of: 1) a ratio of the a top dielectric grid width to a top metallic grid width may be, for example, between about 0.1 to about 2.0; and 2) a ratio of the top dielectric grid width to a metallic grid opening width may be, for example, about 0.1 to about 0.9. A capping layer is arranged between the metallic and the dielectric grids, and defines a lower surface of the dielectric grid opening. A ratio of a stacked grid structure height to the metallic grid opening width may be, for example, about 0.5 to about 2.0, where the stacked grid structure includes the dielectric and metallic grids and the capping layer.

Advantageously, by controlling design parameters, optical performance and optical isolation may be improved. Such design parameters may include, for example, one or more of stacked grid structure height, metallic grid height, dielectric grid height, metallic grid opening width, metallic grid width, and dielectric grid width. Optical performance and optical isolation may be improved by reducing crosstalk, the minimum luminance to achieve a signal-to-noise ratio (SNR) of about 10 (i.e., SNR-10), quantum efficiency (QE), and so on.

With reference to FIG. 1A, a cross-sectional view 100A of some embodiments of a BSI image sensor is provided. The BSI image sensor includes a semiconductor substrate 102 and pixel sensors 104 arranged within the semiconductor substrate 102, typically in rows and/or columns. The pixels sensors 104 are configured to convert incident radiation (e.g., photons) into electrical signals. The pixel sensors 104 include corresponding photodetectors 106 and, in some embodiments, corresponding amplifiers (not shown). The photodetectors 106 may be, for example, photodiodes, and the amplifiers may be, for example, transistors. The photodiodes may include, for example, corresponding first regions (not shown) within the semiconductor substrate 102 having a first doping type (e.g., n-type doping), and corresponding second regions (not shown) overlying the first regions within the semiconductor substrate 102 having a second doping type (e.g., p-type doping) that is different than the first doping type.

An antireflective coating (ARC) 108 and/or a buffer layer 110 are arranged over the semiconductor substrate 102 along an upper surface 112 of the semiconductor substrate 102. In embodiments where both the ARC 108 and the buffer layer 110 are present, the buffer layer 110 is typically arranged over the ARC 108. The ARC 108 may be, for example, an organic polymer or a metallic oxide. The buffer layer 110 may be, for example, an oxide, such as silicon dioxide. The ARC 108 and/or the buffer layer 110 vertically space the semiconductor substrate 102 from a stacked grid 113 that overlies the semiconductor substrate 102.

The stacked grid 113 includes a metallic grid 114 and a dielectric grid 116 overlying the metallic grid 114. The metallic grid 114 and the dielectric grid 116 respectively define sidewalls for metallic grid openings 118 and dielectric grid openings 120A corresponding to the pixel sensors 104, and are configured to confine and guide radiation entering the metallic and dielectric grid openings 118, 120A towards the pixel sensors 104. Typically, the metallic and/or dielectric grid openings 118, 120A at least partially overly the corresponding pixel sensors 104. In some embodiments, as illustrated, centers of the metallic grid openings 118 and/or the dielectric grid openings 120A are aligned over centers of the corresponding pixel sensors 104. In alternative embodiments, centers of the metallic grid openings 118 and/or the dielectric grid openings 120A are laterally shifted or offset from centers of the corresponding pixel sensors 104. The metallic grid openings 118 have substantially planar lower surfaces 122, which may be defined by the ARC 108 and/or the buffer layer 110. The dielectric grid openings 120A have curved lower surfaces. The curved lower surfaces are configured with a curvature that is dependent upon refractive indices of color filters (described hereafter) and an underlying capping layer (described hereafter). For example, as shown in FIG. 1A, if the color filter has a greater refractive index than the capping layer, the dielectric grid openings 120A will have concave lower surfaces 124A.

The metallic grid 114 and the dielectric grid 116 are respectively arranged within metallic and dielectric grid layers 126, 128 stacked over the ARC 108 and/or the buffer layer 110. The metallic grid 114 is arranged within a metallic grid layer 126 overlying the ARC 108 and/or the buffer layer 110. The metallic grid layer 126 may be, for example, tungsten, copper, or aluminum copper. The dielectric grid 116 is arranged within a dielectric grid layer 128 stacked over the metallic grid layer 126. In some embodiments, the dielectric grid 116 is further arranged within an etch stop layer 130 and/or some other layer (e.g., one or more additional dielectric grid layers) underlying the dielectric grid layer 128. The dielectric grid layer 128 may be, for example, an oxide, such as silicon dioxide. The etch stop layer 130 may be, for example, a nitride, such as silicon nitride.

A capping layer 132A is arranged over the metallic grid layer 126 between the metallic grid layer 126 and the dielectric grid layer 128. The capping layer 132A spaces the dielectric grid 116 from the metallic grid 114 and fills the metallic grid openings 118. Further, the capping layer 132A defines the concave lower surfaces 124A of the dielectric grid openings 120A and, in some embodiments, partially defines sidewalls of the dielectric grid openings 120A. The capping layer 132A is a dielectric, such as silicon dioxide. In some embodiments, the capping layer 132A is or otherwise includes the same material as the buffer layer 110 and/or the dielectric grid layer 128. For example, in some embodiments without the etch stop layer 130, the capping layer 132A and the dielectric grid layer 128 have the same molecular structure and/or correspond to different regions of a continuous layer (e.g., a layer formed by a single deposition).

Color filters 134A, 136A, 138A corresponding to the pixel sensors 104 are arranged in the dielectric grid openings 120A to fill the dielectric grid openings 120A. The color filters 134A, 136A, 138A typically have planar upper surfaces 140 that are approximately coplanar with an upper surface 142 of the dielectric grid layer 128. The color filters 134A, 136A, 138A are assigned corresponding colors or wavelengths of radiation, and are configured to transmit radiation corresponding to the assigned colors or wavelengths to the corresponding pixel sensors 104. Typically, the color filter 134A, 136A, 138A assignments alternate between red, green, and blue, such that the color filters 134A, 136A, 138A include red color filters 134A, green color filters 136A, and blue color filters 138A. In some embodiments, the color filter assignments alternative between red, green, and blue light according to a Bayer mosaic. The color filters 134A, 136A, 138A are of a first material with a refractive index greater than that of a second material abutting the first material at the concave lower surfaces 124A of the dielectric grid openings 120A. Typically, the second material is that of the capping layer 132A and/or the dielectric grid layer 128. In some embodiments, each of the color filters 134A, 136A, 138A has a width that decreases from a top surface of the color filter to a midpoint between the top surface and a bottom surface of the color filter and that is further uniform or substantially uniform from the midpoint to the bottom surface.

Micro lenses 144 corresponding to the pixel sensors 104 are arranged over the color filters 134A, 136A, 138A and the pixel sensors 104. Centers of the micro lenses 144 are typically aligned with centers of the pixel sensors 104, but centers of the micro lenses 144 may be laterally shifted or offset from centers of the pixel sensors 104. The micro lenses 144 are configured to focus incident radiation (e.g., light) towards the pixel sensors 104. In some embodiments, the micro lenses 144 have convex upper surfaces 146 configured to focus radiation towards the color filters 134A, 136A, 138A and/or the pixel sensors 104.

In operation, the concave lower surfaces 124A of the dielectric grid openings 120A serve as lenses to focus or concentrate radiation on the corresponding pixel sensors 104. Radiation entering the color filters 134A, 136A, 138A, and impinging on the concave lower surfaces 124A of the dielectric grid openings 120A, may refract towards the metallic grid 114 with an angle of refraction greater than an angle of incidence. Upon impinging on the metallic grid 114, the radiation may reflect towards the pixel sensors 104. For example, suppose a light ray 148A enters a color filter 136A, reflects off a sidewall of the color filter 136A towards a concave lower surface of the corresponding dielectric grid opening, and impinges on the concave lower surface with an angle of incidence $\theta_1$. Further, suppose the color filter 136A has a refractive index $n_1$, and the capping layer 132A has a refractive index $n_2$. In such instances, since $n_1$ is greater than $n_2$, $\theta_2$ is greater than $\theta_1$ and can be computed according to Snell's law as follows.

$$\theta_2 = \sin^{-1}\left(\frac{n_1 \sin(\theta_1)}{n_2}\right)$$

Advantageously, focusing or concentrating radiation on the pixel sensors 104 reduces crosstalk between neighboring pixel sensors and improves optical performance.

Figure 1B:
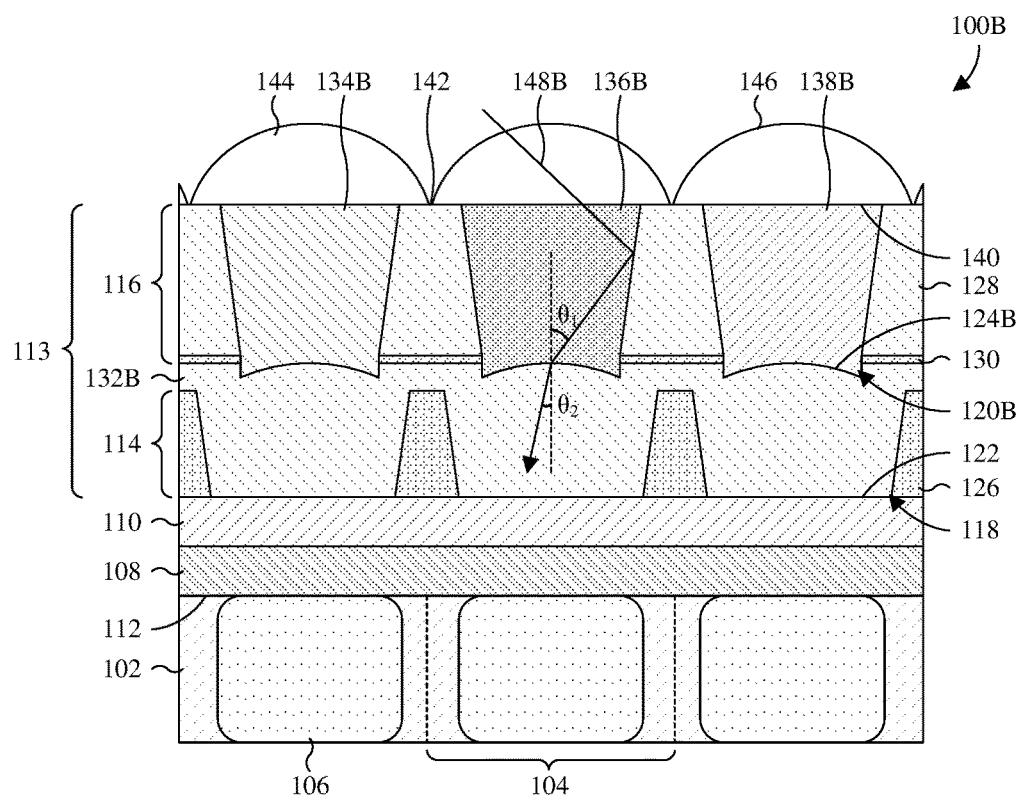
FIG. 1B illustrates a cross-sectional view of some embodiments of a BSI image sensor having color filters with convex lower surfaces.

With reference to FIG. 1B, a cross-sectional view 100B of other embodiments of a BSI image sensor is provided. The BSI image sensor includes a dielectric grid 116 arranged over a capping layer 132B. The dielectric grid 116 defines sidewalls for dielectric grid openings 120B overlying corresponding pixel sensors 104, and the capping layer 132B defines a convex lower surface 124B of the dielectric grid openings 120B. Color filters 134B, 136B, 138B corresponding to the pixel sensors 104 are arranged in the dielectric grid openings 120B to fill the dielectric grid openings 120B. The color filters 134B, 136B, 138B are of a first material with a refractive index less than that of a second material abutting the first material at the convex lower surfaces 124B of the dielectric grid openings 120B. Typically, the second material is that of the capping layer 132B and/or the dielectric grid layer 128.

In operation, the convex lower surfaces 124B of the dielectric grid openings 120B serve as lenses to focus or concentrate radiation on the corresponding pixel sensors 104. Radiation entering the color filters 134B, 136B, 138B, and impinging on the convex lower surfaces 124B of the dielectric grid openings 120B, may refract towards the pixel sensors 104 with an angle of refraction $\theta_2$ less than an angle of incidence $\theta_1$. For example, suppose a light ray 148B enters a color filter 136B, reflects off a sidewall of the color filter 136B towards a convex lower surface of the corresponding dielectric grid opening, and impinges on the convex lower surface with an angle of incidence $\theta_1$. Further, suppose the color filter 136B has a refractive index $n_1$, and the capping layer 132B has a refractive index $n_2$. In such instances, since $n_1$ is less than $n_2$, $\theta_2$ is less than $\theta_1$ and can be computed according to Snell's Law. Advantageously, focusing or concentrating radiation on the pixel sensors 104 reduces crosstalk between neighboring pixel sensors and improves optical performance.

The foregoing embodiments dealt with dielectric grid openings having curved lower surfaces. However, in some embodiments, the dielectric grid openings have planar lower surfaces. In such embodiments, improved control over the design parameters is important to achieve suitable optical performance and optical isolation. Such design parameters may include, for example, one or more of grid height, metallic grid opening width, and top width.

Figure 1C:
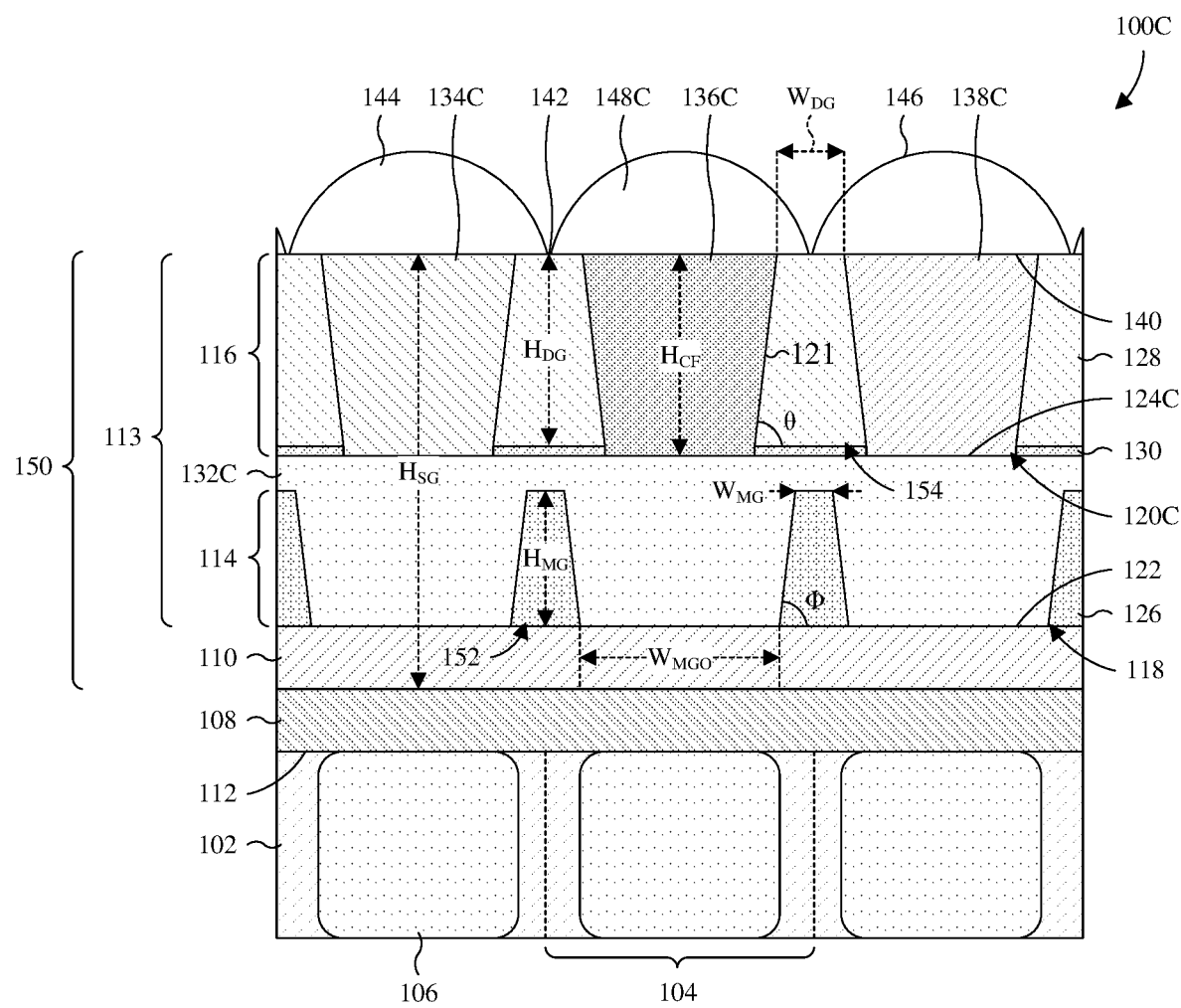
FIG. 1C illustrates a cross-sectional view of some embodiments of a BSI image sensor having color filters with planar lower surfaces.

With reference to FIG. 1C, a cross-sectional view 100C of other embodiments of a BSI image sensor is provided. The BSI image sensor includes a stacked grid structure 150 overlying a semiconductor substrate 102. The stacked grid structure 150 includes a stacked grid 113 vertically spaced from the semiconductor substrate 102 by an ARC 108 and/or a buffer layer 110. The ARC 108 and/or the buffer layer 110 are arranged between the stacked grid 113 and the semiconductor substrate 102, typically with the buffer layer 110 overlying the ARC 108. The stacked grid structure 150 has a height $H_{SG}$ and, in some embodiments (as illustrated), includes the buffer layer 110.

The stacked grid 113 includes a metallic grid 114 and a dielectric grid 116 overlying the metallic grid 114. The metallic grid 114 has a height $H_{MG}$, and the dielectric grid has a height $H_{DG}$. In some embodiments, a ratio of dielectric grid height $H_{DG}$ to metallic grid height $H_{MG}$ (i.e., $H_{DG}/H_{MG}$) is about 1.0 to about 8.0. For example, the ratio $H_{DG}/H_{MG}$ may be about 1.0 to about 3.0, about 3.0 to about 6.0, or about 6.0 to 8.0. The metallic and dielectric grids 114, 116 respectively define sidewalls for metallic and dielectric grid openings 118, 120C corresponding to pixel sensors 104 arranged in the semiconductor substrate 102. The metallic grid openings 118 have lower widths $W_{MGO}$, and the dielectric grid openings 120C have lower surfaces 124C that are typically planar. In some embodiments, a ratio of stacked grid structure height $H_{SG}$ to metallic grid opening width $W_{MGO}$ (i.e., $H_{SG}/W_{MGO}$) is about 0.5 to about 2.0. For example, the ratio $H_{SG}/W_{MGO}$ may be about 0.5 to about 1, or about 1.0 to about 2.0. The metallic and dielectric grids 114, 116 are configured to confine and guide radiation entering the metallic and dielectric grid openings 118, 120C towards the corresponding pixel sensors 104. The metallic and dielectric grids 114, 116 are respectively made up of a plurality of overlapping metallic and dielectric grid segments 152, 154.

The metallic and dielectric grid segments 152, 154 are ring-shaped, such as square-shaped or rectangular-shaped, and have sidewalls angled relative to corresponding lower surfaces at angles θ, Φ. In some embodiments, dielectric grid sidewall angles θ are about 60 degrees to about 90 degrees. For example, the dielectric grid sidewall angles θ may be about 70 degrees to about 80 degrees. Further, the metallic and dielectric grid segments 152, 154 correspond to the metallic and dielectric grid openings 118, 120C and laterally surround the corresponding metallic and dielectric grid openings 118, 120C. The metallic grid segments 152 have top widths $W_{MG}$, and the dielectric grid segments 154 have top widths $W_{DG}$. The top width $W_{MG}$, $W_{DG}$ spans from an interior sidewall of the corresponding metallic and dielectric grid segments 152, 154 to an exterior sidewall of the corresponding metallic and dielectric grid segments 152, 154 (recall that the metallic and dielectric grid segments 152, 154 are ring-shaped). In some embodiments, a ratio of dielectric grid segment width $W_{DG}$ to metallic grid segment width $W_{MG}$ (i.e., $W_{DG}/W_{MG}$) is about 0.1 to about 2.0. For example, the ratio $W_{DG}/W_{MG}$ may be about 0.1 to about 1.0, or about 1.0 to about 2.0. Further, in some embodiments, a ratio of dielectric grid segment width $W_{DG}$ to metallic grid opening width $W_{MGO}$ (i.e., $W_{DG}/W_{MGO}$) is about 0.1 to about 0.9. For example, the ratio $W_{DG}/W_{MGO}$ may be about 0.1 to about 0.5, or about 0.5 to about 0.9.

A capping layer 132C of the stacked grid structure 150 is arranged between the metallic grid 114 and the dielectric grid 116 to define the lower surfaces 124C of the dielectric grid openings 120C. Further, color filters 134C, 136C, 138C corresponding to the pixel sensors 104 are arranged in the dielectric grid openings 120C to at least partially fill the dielectric grid openings 120C. The color filters 134C, 136C, 138C have a refractive index different than that of the dielectric grid 116, and have heights $H_{CF}$. In some embodiments, a ratio of dielectric grid height $H_{DG}$ to color filter height $H_{CF}$ (i.e., $H_{DG}/H_{CF}$) is about 0.1 to about 2.0. For example, the ratio $H_{DG}/H_{CF}$ may be about 0.1 to about 1.0, or about 1.0 to about 2.0.

Advantageously, by controlling design parameters, optical performance and optical isolation may be improved (e.g., by reducing cross talk, SNR-10, and so on). Such design parameters may include, for example, one or more of stacked grid structure height $H_{SG}$, metallic grid height $H_{MG}$, dielectric grid height $H_{DG}$, color filter height $H_{CF}$, metallic grid opening width $W_{MGO}$, metallic grid segment width $W_{MG}$, and dielectric grid segment width $W_{DG}$. Further, while the discussion of FIG. 1C dealt with metallic grid opening width $W_{MGO}$, it is to be appreciated that pixel pitch (e.g., the lateral distance between the centers of neighboring pixel sensors) may be used in place of metallic grid opening width $W_{MGO}$ for the various ratios.

Figure 1D:
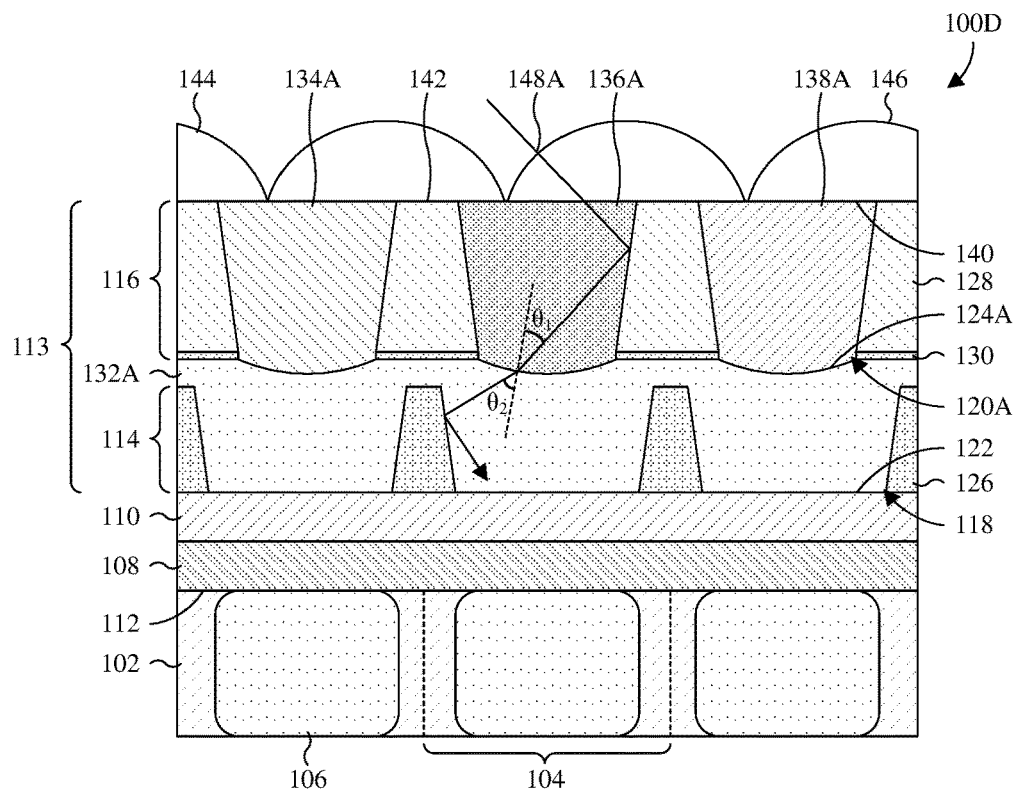
FIG. 1D illustrates a cross-sectional view of some embodiments of a BSI image sensor having micro-lenses that are laterally shifted or offset from centers of pixel sensors.

With reference to FIG. 1D, a cross-sectional view 100D of other embodiments of a BSI image sensor is provided in which micro lenses 144 are laterally shifted or offset from centers of pixel sensors 104. FIG. 1D is as FIG. 1A is illustrated and described except for the lateral shift or offset with the micro lenses 144.

Figure 1E:
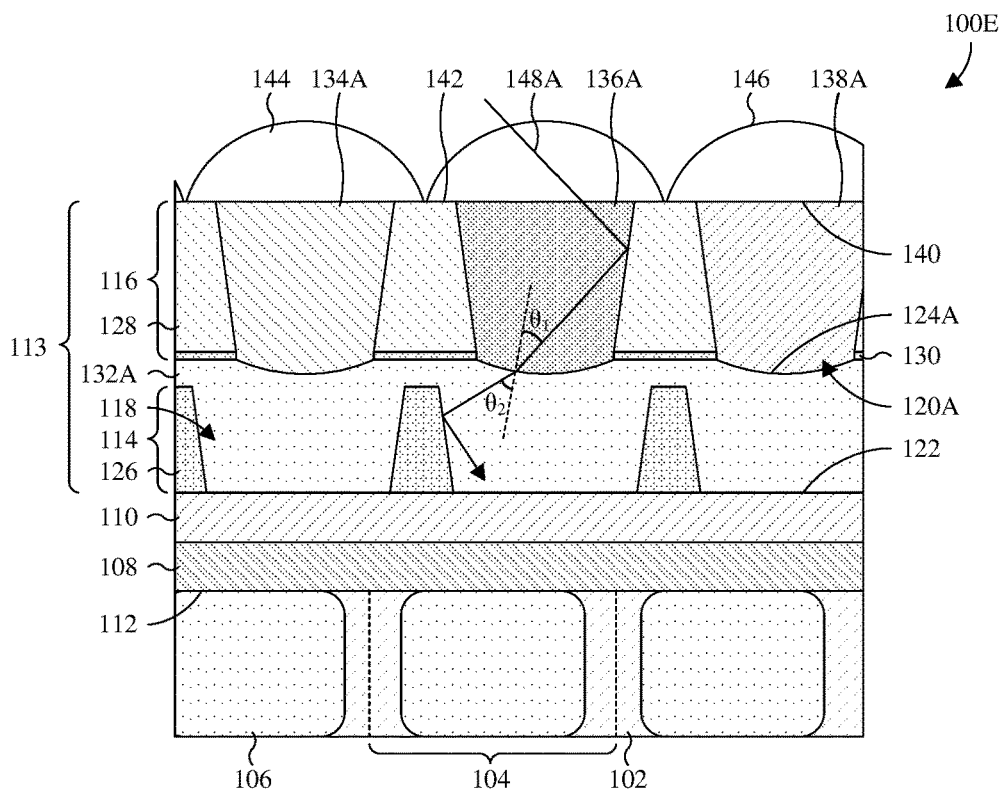
FIG. 1E illustrates a cross-sectional view of some embodiments of a BSI image sensor having micro-lenses, dielectric grid openings, and metallic grid openings that are laterally shifted or offset from centers of pixel sensors.

With reference to FIG. 1E, a cross-sectional view 100E of other embodiments of a BSI image sensor is provided in which micro lenses 144, dielectric grid openings 120A, and metallic grid openings 118 are laterally shifted or offset from centers of pixel sensors 104. FIG. 1E is as FIG. 1A is illustrated and described except for the lateral shift or offset with the micro lenses 144, the dielectric grid openings 120A, and the metallic grid openings 118.

Figure 1F:
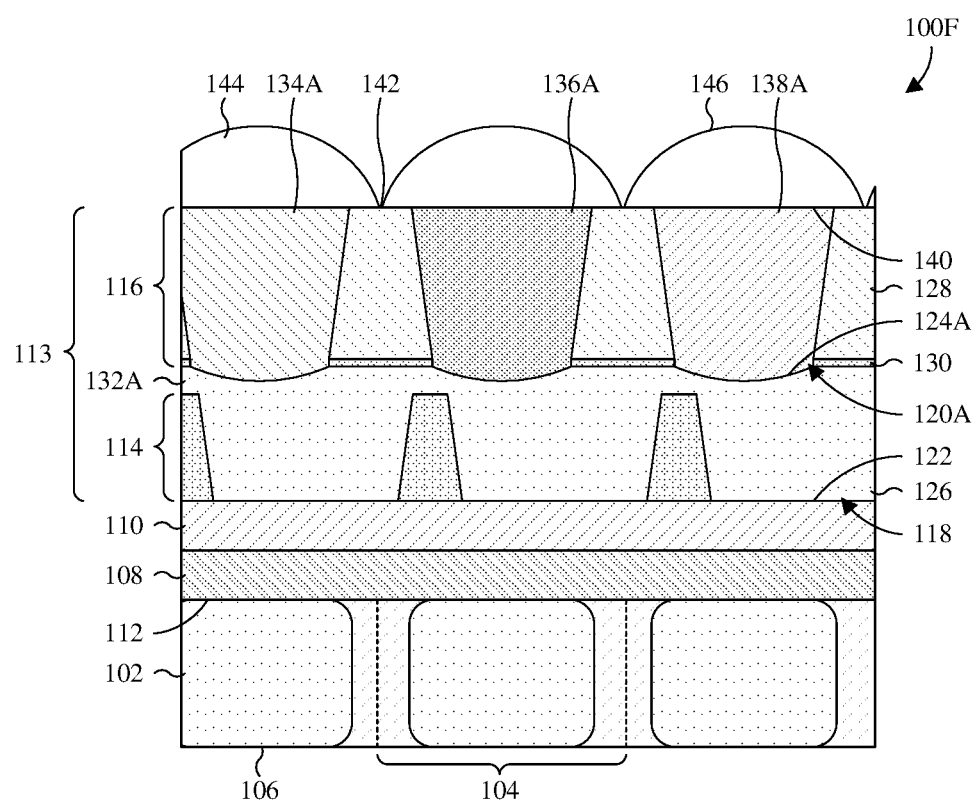
FIG. 1F illustrates a cross-sectional view of some embodiments of a BSI image sensor having metallic grid openings that are laterally shifted or offset from centers of pixel sensors.

With reference to FIG. 1F, a cross-sectional view 100F of other embodiments of a BSI image sensor is provided in which metallic grid openings 118 are laterally shifted or offset from centers of pixel sensors 104. FIG. 1F is as FIG. 1A is illustrated and described except for the lateral shift or offset with the metallic grid openings 118.

Figure 14A:
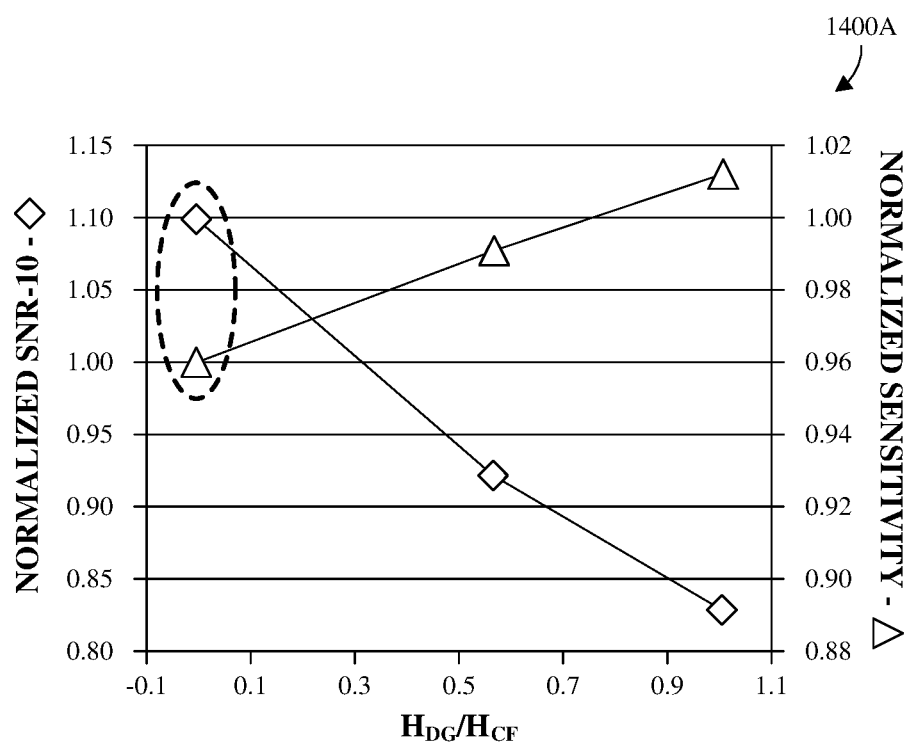
FIGS. 14A-14C illustrate some embodiments of graphs showing the effect design parameters have on optical performance and isolation.

With reference to FIG. 14A, some embodiments of a graph 1400A are provided to illustrate the effect that a ratio of dielectric grid height $H_{DG}$ to color filter height $H_{CF}$ (i.e., $H_{DG}/H_{CF}$) has on optical performance. The independent axis corresponds to the ratio and spans from about −0.1 to about 1.1. The dependent axis corresponds to either normalized SNR-10 or normalized sensitivity, depending upon which side of the graph 1400A is used for the dependent axis. On the left side of the graph 1400A, the dependent axis corresponds to normalized SNR-10 and spans from about 0.8 to about 1.15. On the right side of the graph 1400A, the dependent axis corresponds to normalized sensitivity and spans from about 0.88 to about 1.02.

Diamond shaped markers and triangle shaped markers are respectively plotted on the graph 1400A for normalized SNR-10 and normalized sensitivity, and lines interconnect the markers to make the trends clearer. Markers corresponding to known values for the ratio are demarcated by a dashed oval. As seen, normalized SNR-10 advantageously decreases as the ratio increases from about 0.1 to about 2. Further, normalized sensitivity advantageously increases as the ratio increases. Similar trends with SNR-10 and normalized sensitivity are expected with a ratio of dielectric grid height $H_{DG}$ to metallic grid height $H_{MG}$ (i.e., $H_{DG}/H_{MG}$).

Figure 14B:
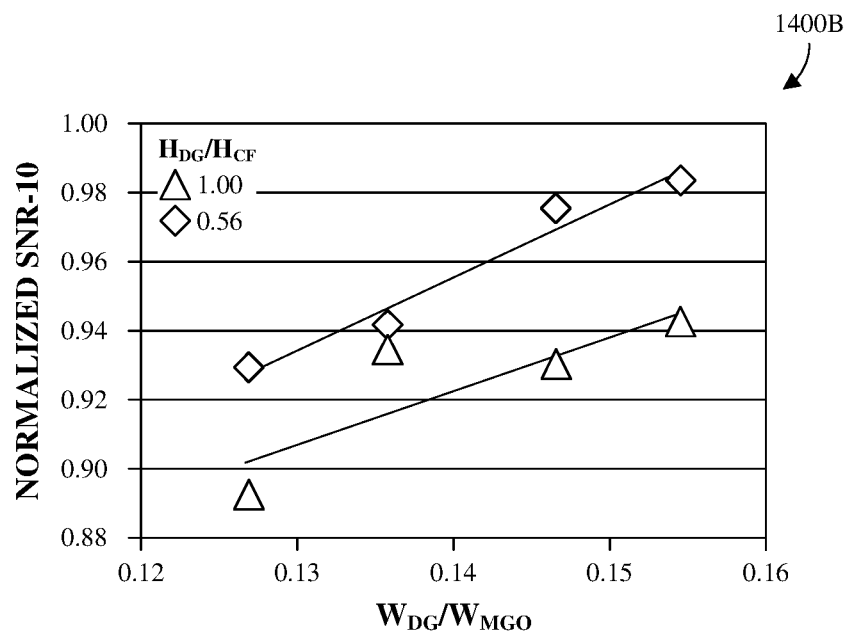

With reference to FIG. 14B, some embodiments of a graph 1400B are provided to illustrate the effect that a ratio of dielectric grid segment width $W_{DG}$ to metallic grid opening width $W_{MGO}$ (i.e., $W_{DG}/W_{MGO}$) has on normalized SNR-10. The independent axis corresponds to the ratio and spans from about 0.12 to about 0.16. The dependent axis corresponds to normalized SNR-10 and spans from about 0.88 to about 1.00.

Diamond shaped markers and triangle shaped markers are respectively plotted on the graph 1400B for different ratios of dielectric grid height $H_{DG}$ to color filter height $H_{CF}$ (see, e.g., FIG. 14A), and best-fit lines span between the markers to make the trends clearer. The diamond shaped markers correspond to a ratio of dielectric grid height $H_{DG}$ to color filter height $H_{CF}$ that is about 1.00. The triangle shaped markers correspond to a ratio of dielectric grid height $H_{DG}$ to color filter height $H_{CF}$ that is about 0.56. As seen, normalized SNR-10 increases as the ratio of dielectric grid segment width $W_{DG}$ to metallic grid opening width $W_{MGO}$ increases from about 0.125 to about 0.155. This is because, as the dielectric grid segment width $W_{DG}$ increases, less light enters the color filters 134C, 136C, 138C, thereby reducing the signal along with noise. Similar trends with SNR-10 are expected with a ratio of dielectric grid segment width $W_{DG}$ to metallic grid segment width $W_{MG}$ (i.e., $W_{DG}/W_{MG}$). Thus, a ratio of dielectric grid segment width $W_{DG}$ to width of metallic grid openings $W_{MGO}$, ranging between 0.1 and 0.9 is preferred.

Figure 14C:
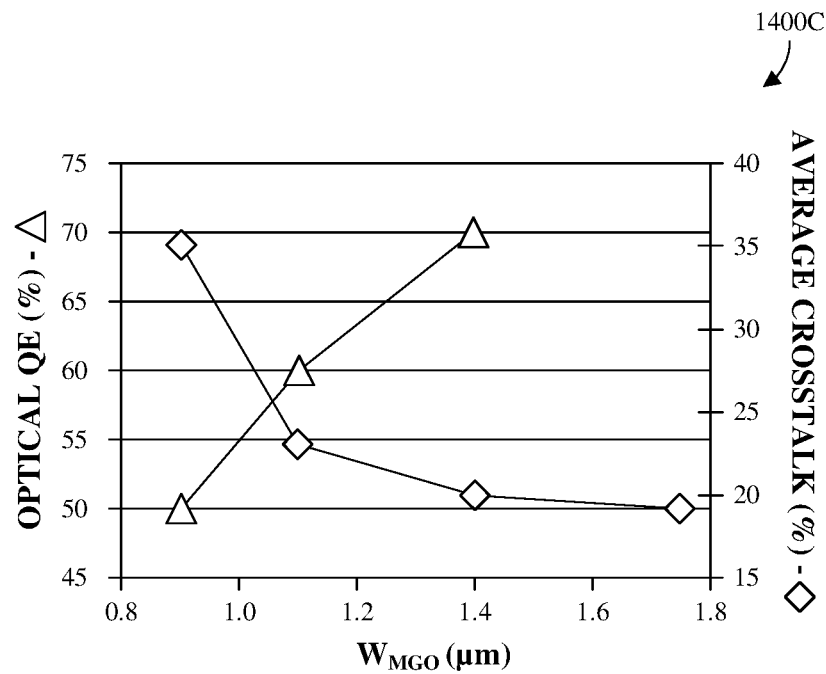

With reference to FIG. 14C, some embodiments of a graph 1400C are provided to illustrate the effect that metallic grid opening width $W_{MGO}$ has on optical performance. The independent axis corresponds to metallic grid opening width $W_{MGO}$ in micrometers (µm). The dependent axis corresponds to either optical QE (as a percentage) or average crosstalk (as a percentage), depending upon which side of the graph 1400C is used for the dependent axis. On the left side of the graph 1400C, the dependent axis corresponds to optical QE and spans from about 45% to about 75%. On the right side of the graph 1400C, the dependent axis corresponds to average crosstalk and spans from about 15% to about 40%.

Diamond shaped markers and triangle shaped markers are respectively plotted on the graph 1400C for average crosstalk and optical QE, and lines interconnect the markers to make the trends clearer. As seen, average crosstalk decreases as metallic grid opening width $W_{MGO}$ increases. Further, optical QE increases as metallic grid opening width $W_{MGO}$ increases.

Figure 2A:
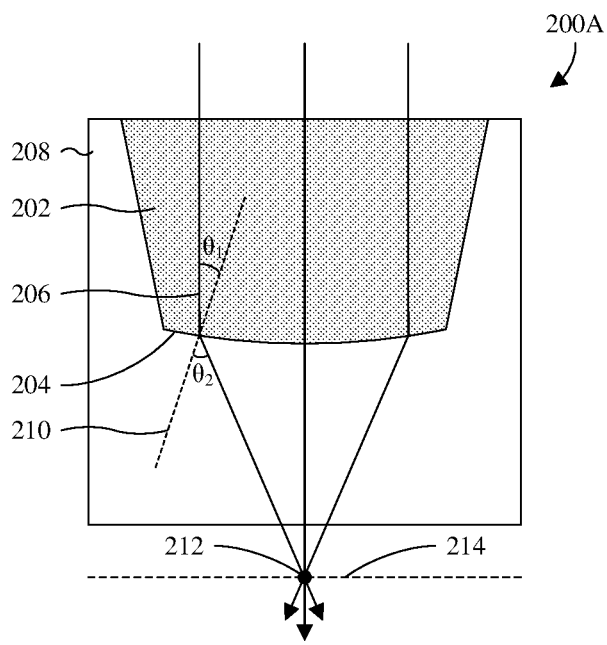
FIG. 2A illustrates a ray diagram of some embodiments of a BSI image sensor having a color filter with a concave lower surface.

With reference to FIG. 2A, a ray diagram 200A of some embodiments of a BSI image sensor having a color filter 202 with a concave lower surface 204 is provided. As illustrated, light rays 206 enter the color filter 202 and impinge on the concave lower surface 204 in parallel. Since the color filter 202 has a first index of refraction that is greater than a second index of refraction of an underlying, abutting layer 208, the light rays 206 will refract away from corresponding normal axes 210 to an underlying focal point 212 (similar to a convex lens) proximate to an underlying pixel sensor. In other words, the higher refractive index of the color filter 202 relative to the underlying layer 208 causes the light rays 206 to have angles of refraction $\theta_2$ that are greater than corresponding angles of incidence $\theta_1$, thereby focusing the light rays 206 towards the underlying pixel sensor. Other light rays (not shown) that are not parallel to the light rays 206 and that enter the color filter 202 refract as described above and intersect other focal points along a focal plane 214, which includes the focal point 212.

Figure 2B:
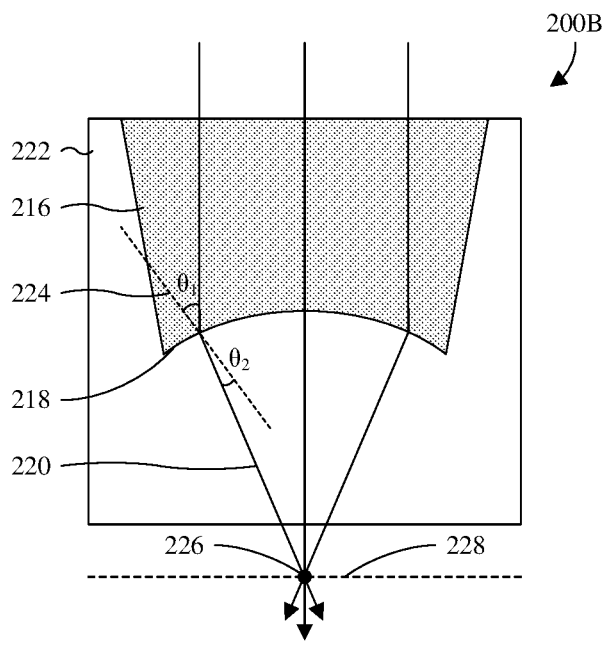
FIG. 2B illustrates a ray diagram of some embodiments of a BSI image sensor having a color filter with a convex lower surface.

With reference to FIG. 2B, a ray diagram 200B of some embodiments of a BSI image sensor having a color filter 216 with a convex lower surface 218 is provided. As illustrated, light rays 220 enter the color filter 216 and impinge on the convex lower surface 218 in parallel. Since the color filter 216 has a first index of refraction that is less than a second index of refraction of an underlying, abutting layer 222, the light rays 220 will refract towards corresponding normal axes 224 to an underlying focal point 226 (similar to a convex lens) proximate to an underlying pixel sensor. In other words, the low refractive index of the color filter 216 relative to the underlying layer 222 causes the light rays 220 to have angles of refraction $\theta_2$ that are less than corresponding angles of incidence $\theta_1$, thereby focusing the light rays 220 towards the underlying pixel sensor. Other light rays (not shown) that are not parallel to the light rays 220 and that enter the color filter 216 refract as described above and intersect other focal points along a focal plane 228, which includes the focal point 226.

Figure 3:
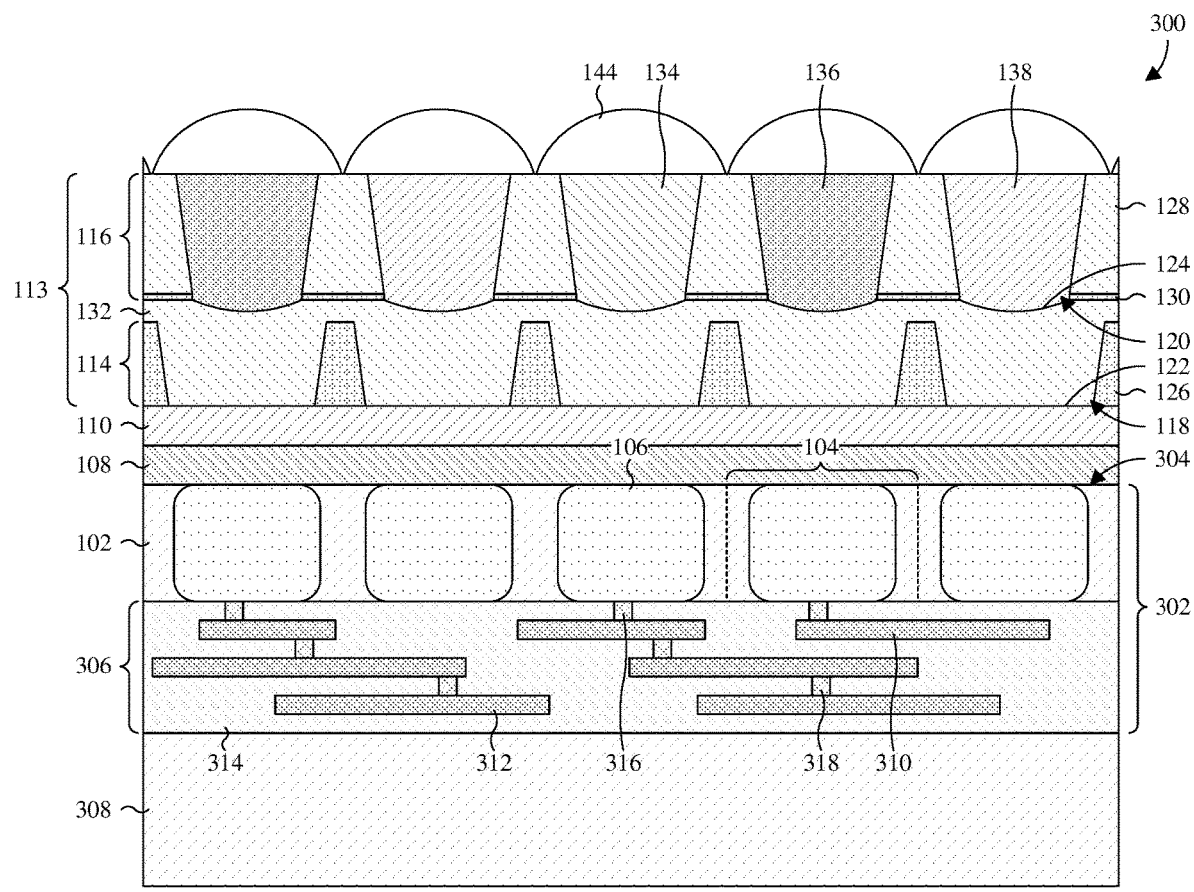
FIG. 3 illustrates a cross-sectional view of some embodiments of a BSI image sensor having color filters with curved lower surfaces.

With reference to FIG. 3, a cross-sectional view 300 of yet other embodiments of a BSI image sensor is provided. The BSI image sensor includes an array of pixel sensors 104 arranged in rows and columns in a semiconductor substrate 102 of an integrated circuit 302 between a back side 304 of the integrated circuit 302 and a BEOL metallization stack 306 of the integrated circuit 302. The pixel sensors 104 include corresponding photodetectors 106 and, in some embodiments, amplifiers (not shown). The photodetectors 106 are configured to convert incident radiation (e.g., photons) into electrical signals, and may be, for example, photodiodes.

The BEOL metallization stack 306 underlies the semiconductor substrate 102 between the semiconductor substrate 102 and a carrier substrate 308. The BEOL metallization stack 306 includes a plurality of metallization layers 310, 312 stacked within an interlayer dielectric (ILD) layer 314. One or more contacts 316 of the BEOL metallization stack 306 extend from a metallization layer 310 to the pixel sensors 104. Further, one or more vias 318 of the BEOL metallization stack 306 extend between the metallization layers 310, 312 to interconnect the metallization layers 310, 312. The ILD layer 314 may be, for example, a low κ dielectric (i.e., a dielectric with a dielectric constant less than about 3.9) or an oxide. The metallization layers 310, 312, the contacts 316, and the vias 318 may be, for example, a metal, such as copper or aluminum.

An ARC 108 and/or a buffer layer 110 are arranged along the back side 304 of the integrated circuit 302, and a stacked grid 113 is arranged over the ARC 108 and/or the buffer layer 110. The stacked grid 113 includes a metallic grid 114 and a dielectric grid 116 overlying the metallic grid 114. The metallic grid 114 and the dielectric grid 116 are respectively arranged within metallic and dielectric grid layers 126, 128 stacked over the ARC 108 and/or the buffer layer 110. In some embodiments, the dielectric grid 116 is further arranged within an etch stop layer 130 underlying a dielectric grid layer 128 of the dielectric grid 116. Further, the metallic grid 114 and the dielectric grid 116 respectively define sidewalls for metallic grid openings 118 and dielectric grid openings 120 corresponding to the pixel sensors 104. The metallic grid openings 118 have substantially planar lower surfaces 122, which may be defined by the ARC 108 and/or the buffer layer 110, whereas the dielectric grid openings 120 have curved lower surfaces 124. The curved lower surfaces 124 may be concave (e.g., as illustrated, and described in FIG. 1A) or convex (e.g., as described in FIG. 1B).

A capping layer 132 is arranged over the metallic grid 114 between the metallic grid layer 126 and the dielectric grid layer 128. Further, color filters 134, 136, 138 and micro lenses 144 corresponding to the pixel sensors 104 are over the corresponding pixel sensors 104. The color filters 134, 136, 138 fill the dielectric grid openings 120, and the micro lenses 144 mask the color filters 134, 136, 138 to focus light into the color filters 134, 136, 138.

Figure 4:
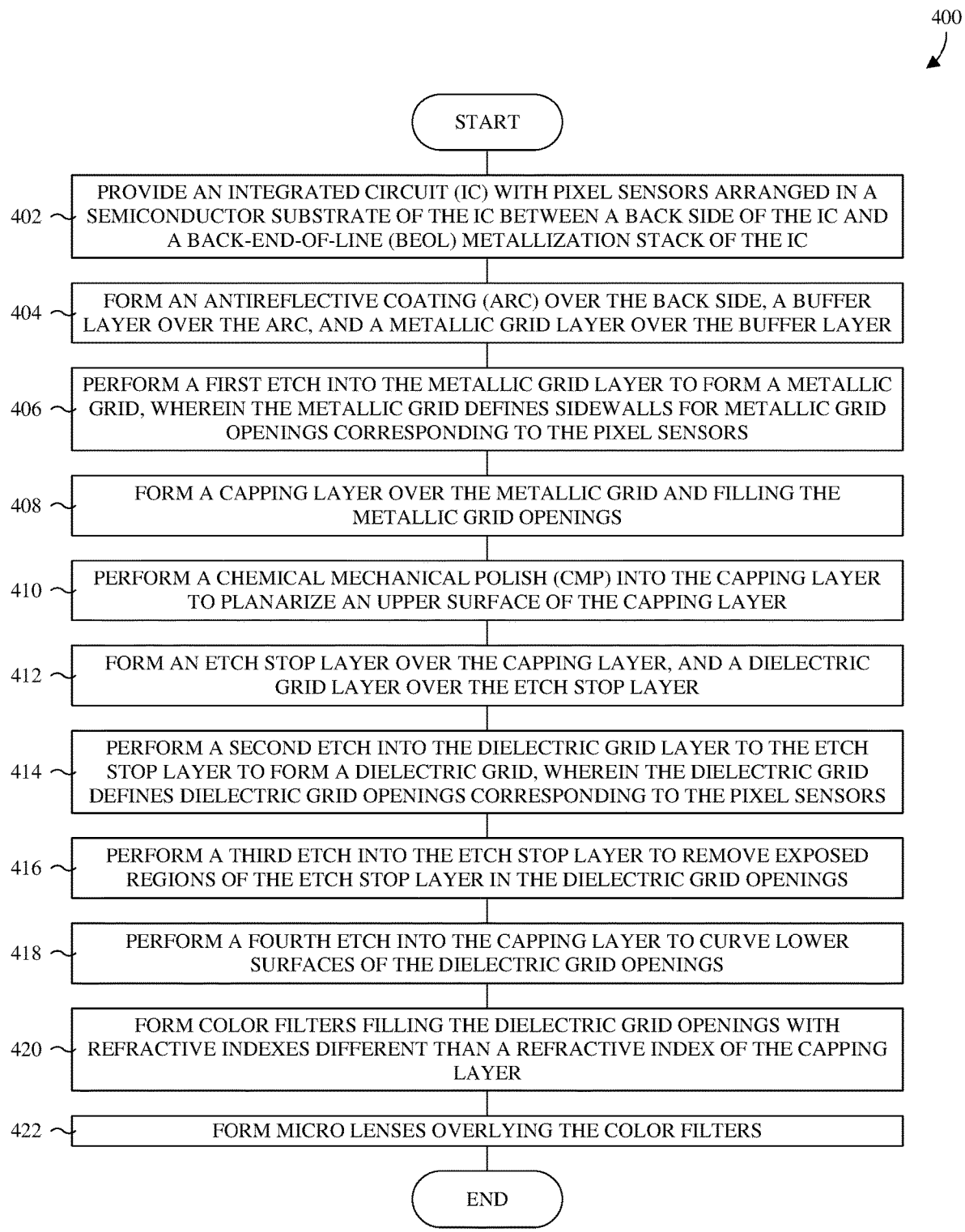
FIG. 4 illustrates a flowchart of some embodiments of a method for manufacturing a BSI image sensor having color filters with curved lower surfaces.

With reference to FIG. 4, a flowchart 400 of some embodiments of a method for manufacturing a BSI image sensor having color filters with curved lower surfaces is provided.

At 402, an integrated circuit is provided with pixel sensors arranged in a semiconductor substrate of the integrated circuit between a back side of the integrated circuit and a BEOL metallization stack of the integrated circuit.

At 404, an ARC is formed over the back side, a buffer layer is formed over the ARC, and a metallic grid layer is formed over the buffer layer.

At 406, a first etch is performed into the metallic grid layer to form a metallic grid. The metallic grid defines sidewalls for metallic grid openings corresponding to the pixel sensors.

At 408, a capping layer is formed over the metallic grid and filling the metallic grid openings.

At 410, a chemical mechanical polish (CMP) is performed into the capping layer to planarize an upper surface of the capping layer.

At 412, an etch stop layer is formed over the capping layer, and a dielectric grid layer is formed over the etch stop layer.

At 414, a second etch into the dielectric grid layer to the etch stop layer to form a dielectric grid. The dielectric grid defines dielectric grid openings corresponding to the pixel sensors.

At 416, a third etch is performed into the etch stop layer to remove exposed regions of the etch stop layer in the dielectric grid openings.

At 418, a fourth etch is performed into the capping layer to curve lower surfaces of the dielectric grid openings.

At 420, color filters are formed filling the dielectric grid openings with refractive indexes different than a refractive index of the capping layer. Advantageously, the differing refractive indexes, combined with the curved lower surfaces of the dielectric grid openings, focus radiation towards underlying pixel sensors. This advantageously reduces dispersion of radiation proximate the lower surface of the dielectric grid, and reduces crosstalk between neighboring pixel sensors. Further, this advantageously improves optical performance.

At 422, micro lenses are formed over the color filters.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some alternative embodiments, the second and third etches, and/or the third and fourth etches, may be performed together (e.g., with a common etchant). Further, in some embodiments, the etch stop layer and Act 416 may be omitted. In such embodiments, the second etch may be time based using known etch rates. Even more, in some alternative embodiments, the capping layer and the dielectric grid layer may correspond to different regions of a common layer. In such embodiments, Acts 408, 410, 412 may be omitted. In place of Acts 408, 410, 412, a common layer may formed (e.g., with a single deposition) over the metallic grid and filling the metallic grid openings. Further, a CMP may be performed into the common layer to planarize an upper surface of the common layer, and Acts 414-422 may be performed. Moreover, in some embodiments, the fourth etch may be omitted.

With reference to FIGS. 5-11, 12A & B, and 13A & B, cross-sectional views of some embodiments of a BSI image sensor at various stages of manufacture are provided to illustrate the method of FIG. 4. Although FIGS. 5-11, 12A & B, and 13A & B are described in relation to the methods, it will be appreciated that the structures disclosed in FIGS. 5-11, 12A & B, and 13A & B are not limited to the methods, but instead may stand alone as structures independent of the methods. Similarly, although the methods are described in relation to FIGS. 5-11, 12A & B, and 13A & B, it will be appreciated that the methods are not limited to the structures disclosed in FIGS. 5-11, 12A & B, and 13A & B, but instead may stand alone independent of the structures disclosed in FIGS. 5-11, 12A & B, and 13A & B.

Figure 5:
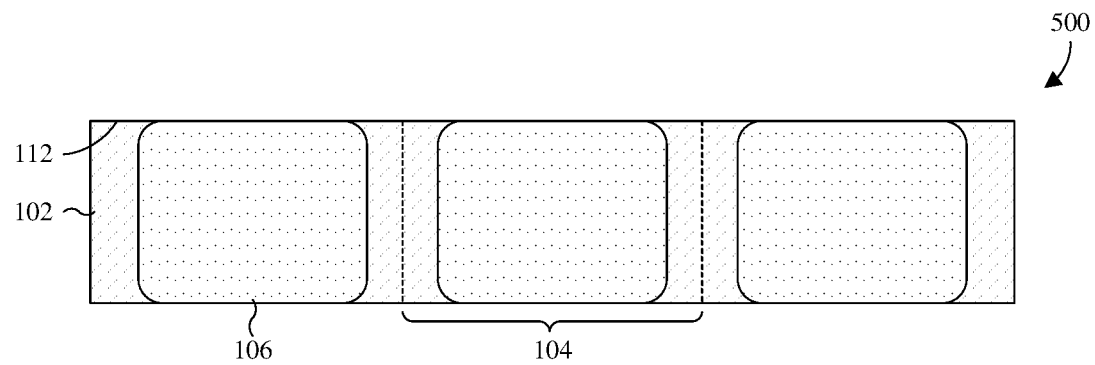
FIGS. 5-11, 12A & 12B, and 13A & 13B illustrate a series of cross-sectional views of some embodiments of a BSI image sensor at various stages of manufacture.

FIG. 5 illustrates a cross-sectional view 500 of some embodiments corresponding to Act 402. As illustrated, a semiconductor substrate 102 with pixel sensors 104 arranged within the semiconductor substrate 102 is provided. In some embodiments, the semiconductor substrate 102 is part of an integrated circuit and the pixel sensors 104 are arranged between a back side of the integrated circuit (e.g., an upper surface 112 of the semiconductor substrate 102) and a BEOL metallization stack (not shown) of the integrated circuit. The pixel sensors 104 include photodetectors 106, such as photodiodes. The semiconductor substrate 102 may be, for example, a bulk semiconductor substrate or a silicon-on-insulator (SOI) substrate.

Figure 6:
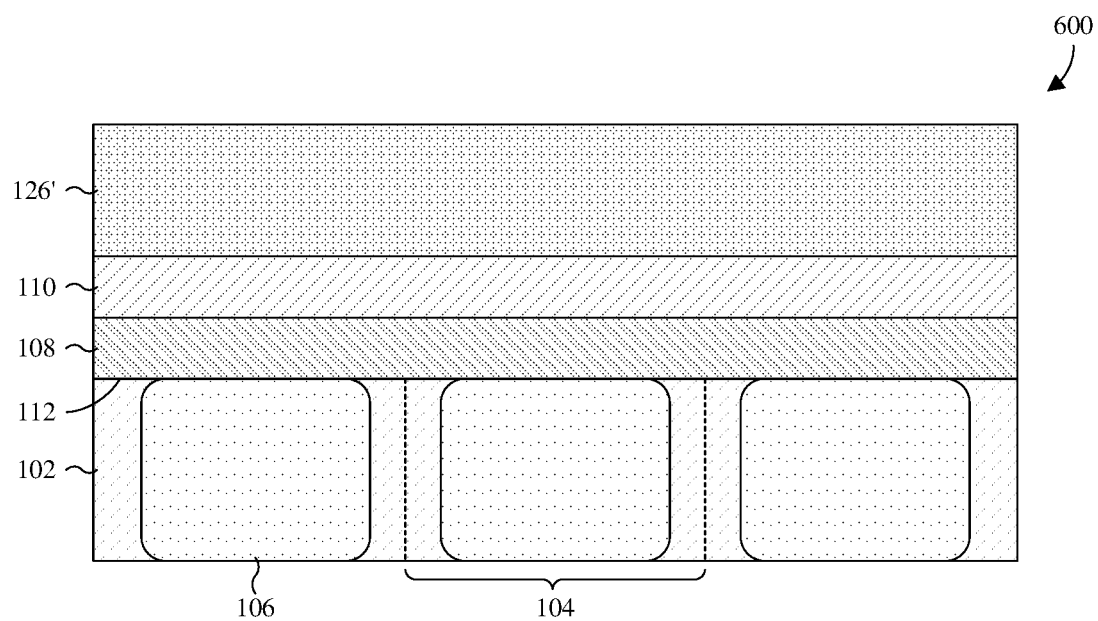

FIG. 6 illustrates a cross-sectional view 600 of some embodiments corresponding to Act 404. As illustrated, an ARC 108 and/or a buffer layer 110 are formed stacked in that order over the semiconductor substrate 102. Further, a metallic grid layer 126' is formed over the ARC 108 and/or the buffer layer 110. The ARC 108, the buffer layer 110, and the metallic grid layer 126' may be sequentially formed by deposition techniques, such as spin coating or vapor deposition. The ARC 108 may be formed of, for example, an organic polymer or a metallic oxide. The buffer layer 110 may be formed of, for example, an oxide, such as silicon dioxide. The metallic grid layer 126' may be formed of, for example, tungsten, copper, aluminum, or aluminum copper.

Figure 7:
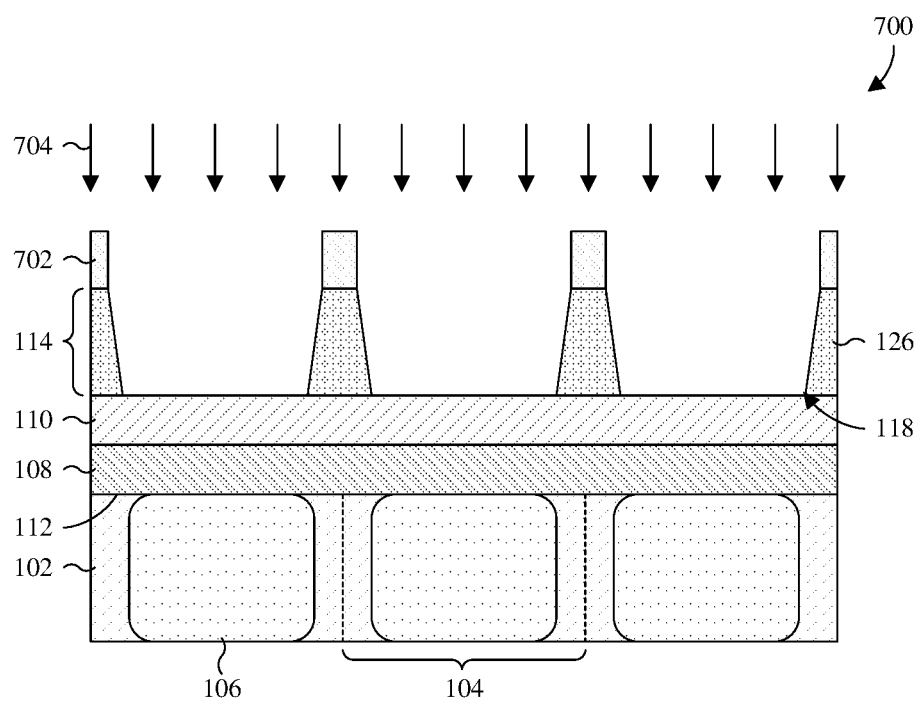

FIG. 7 illustrates a cross-sectional view 700 of some embodiments corresponding to Act 406. As illustrated, a first etch is performed into the metallic grid layer 126', through regions overlying the pixel sensors 104, to the ARC 108 and/or the buffer layer 110. The first etch forms a metallic grid 114 defining sidewalls for metallic grid openings 118 corresponding to the pixel sensors 104. Typically, the metallic grid openings 118 at least partially overly the corresponding pixel sensors 104.

The process for performing the first etch may include forming a first photoresist layer 702 masking regions of the metallic grid layer 126' corresponding to the metallic grid 114. An etchant 704 may then be applied to the metallic grid layer 126' according to a pattern of the first photoresist layer 702, thereby defining the metallic grid 114. The etchant 704 may be selective of the metallic grid layer 126' relative to the ARC 108 and/or the buffer layer 110. Further, the etchant 704 may be, for example, a dry etchant. After applying the etchant 704, the first photoresist layer 702 may be removed or otherwise stripped.

Figure 8:
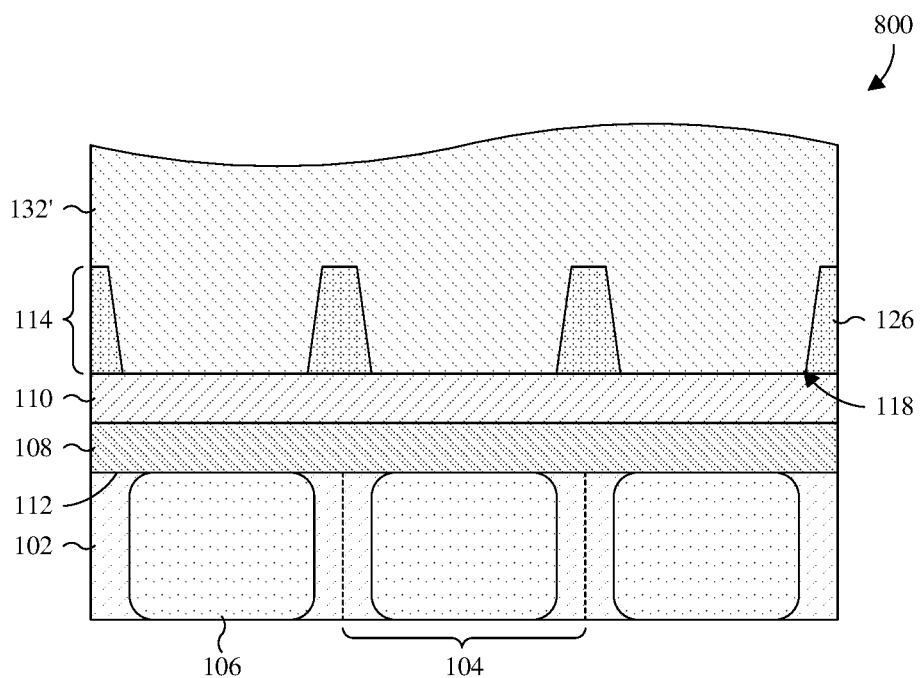

FIG. 8 illustrates a cross-sectional view 800 of some embodiments corresponding to Act 408. As illustrated, a capping layer 132' is formed over the metallic grid 114 and the remaining metallic grid layer 126, and filling the metallic grid openings 118. The capping layer 132' may be formed of, for example, a dielectric, such as an oxide, and/or may be formed of, for example, the same material as the buffer layer 110. Further, the capping layer 132' may be formed using, for example, a deposition technique, such as spin coating or vapor deposition.

Figure 9:
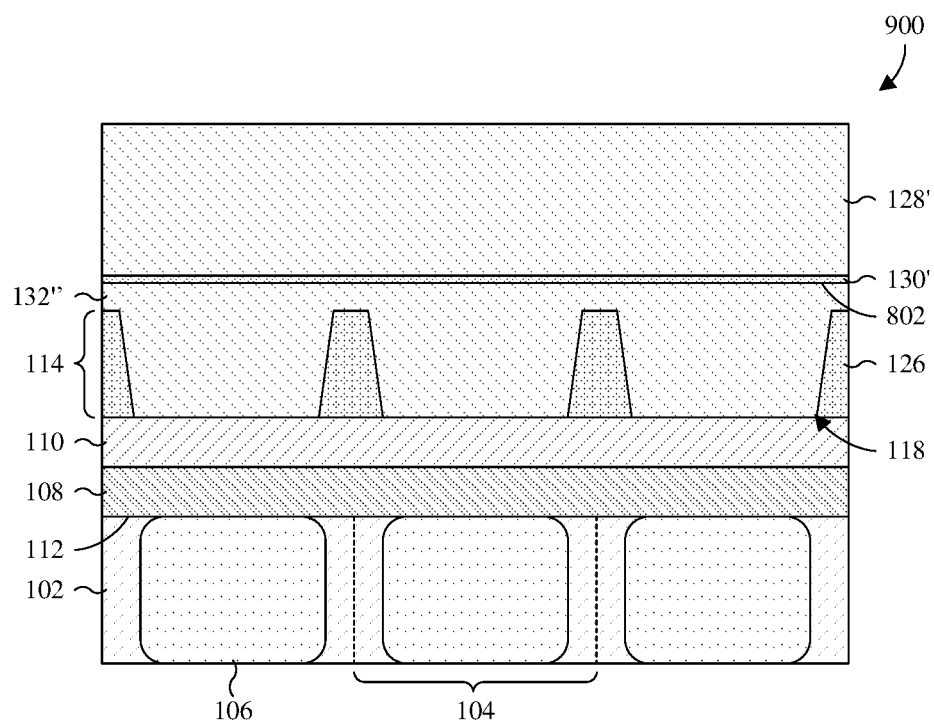

FIG. 9 illustrates a cross-sectional view 900 of some embodiments corresponding to Acts 410 and 412. As illustrated, a CMP is performed into the capping layer 132' to a point over the remaining metallic grid layer 126, thereby resulting in a substantially planar upper surface 902. Also illustrated, an etch stop layer 130' and a dielectric grid layer 128' are formed stacked in that order over the remaining capping layer 132". The etch stop layer 130' and the dielectric grid layer 128' may be formed using, for example, a deposition technique, such as vapor deposition. The etch stop layer 130' may be formed of, for example, a nitride, such as silicon nitride. The dielectric grid layer 128' may be formed of, for example, silicon dioxide, and/or may be formed of, for example, the same material as the remaining capping layer 132". In alternative embodiments, the etch stop layer 130' may be omitted.

Figure 10:
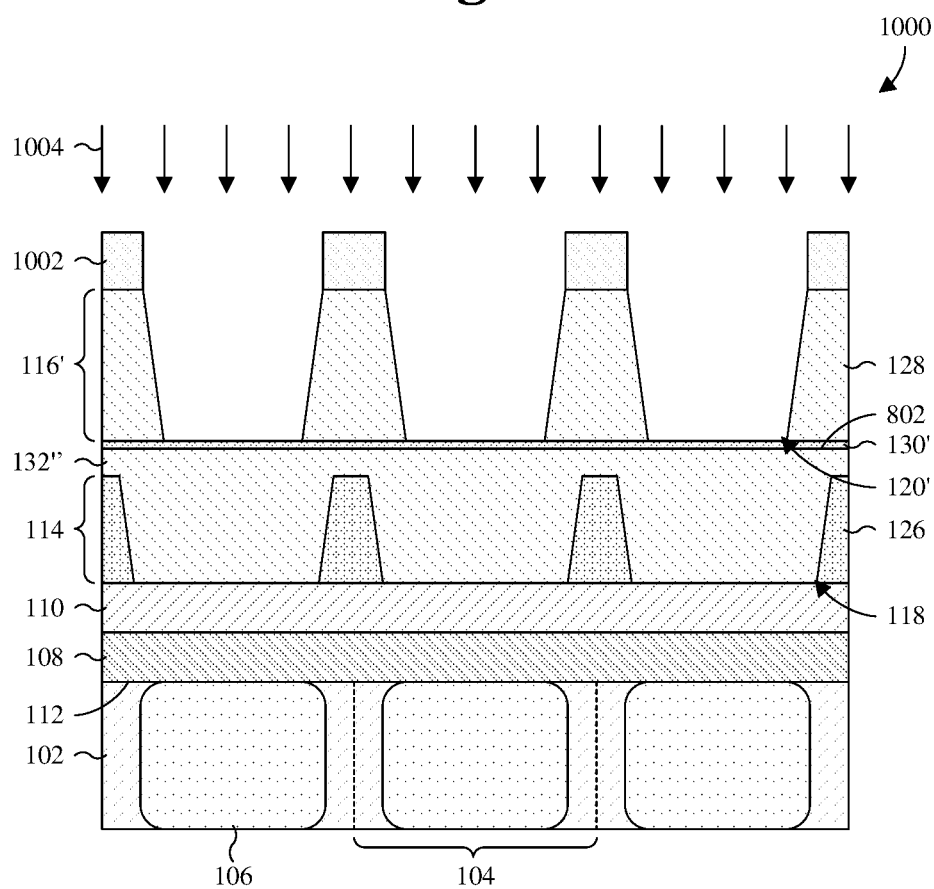

FIG. 10 illustrates a cross-sectional view 1000 of some embodiments corresponding to Act 414. As illustrated, a second etch is performed into the dielectric grid layer 128', through regions overlying the pixel sensors 104, to the etch stop layer 130'. The second etch forms a dielectric grid 116' defining sidewalls for dielectric grid openings 120' corresponding to the pixel sensors 104. Typically, the dielectric grid openings 120' at least partially overly the corresponding pixel sensors 104.

The process for performing the second etch may include forming a second photoresist layer 1002 masking regions of the dielectric grid layer 128' corresponding to the dielectric grid 116'. An etchant 1004 may then be applied to the dielectric grid layer 128' according to a pattern of the second photoresist layer 1002, thereby defining the dielectric grid 116'. The etchant 1004 may be selective of the dielectric grid layer 128' relative to the etch stop layer 130'. Further, the etchant 1004 may be, for example, a dry etchant. After applying the etchant 1004, the second photoresist layer 1002 may be removed or otherwise stripped.

Figure 11:
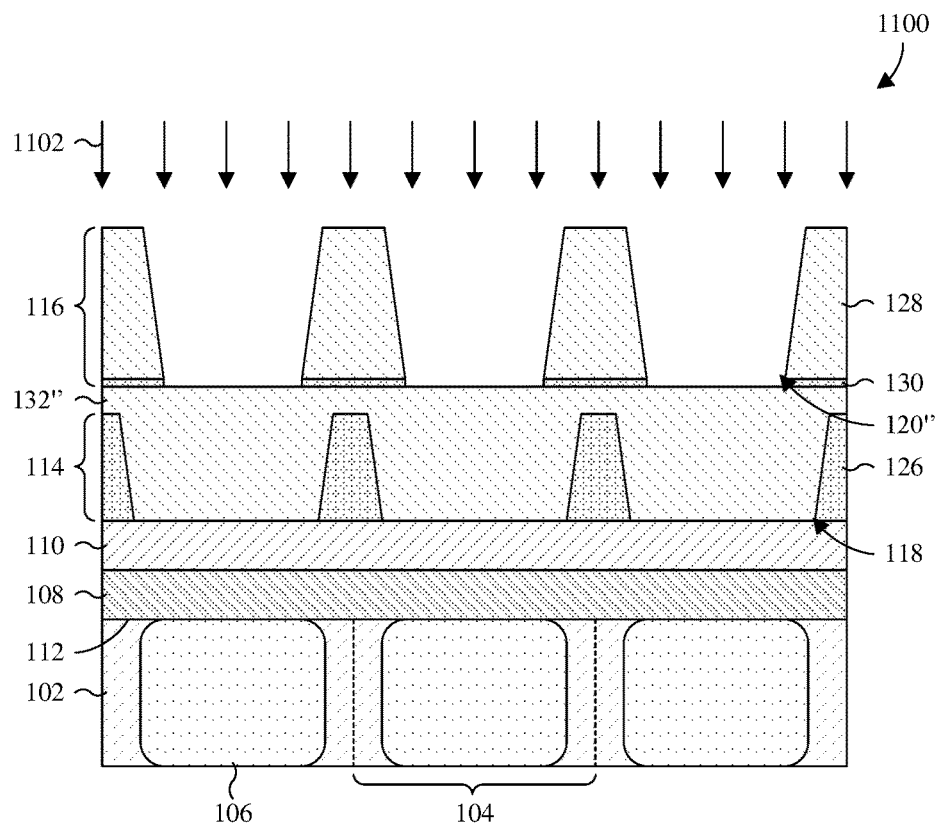

FIG. 11 illustrates a cross-sectional view 1100 of some embodiments corresponding to Act 416. As illustrated, a third etch is performed into the etch stop layer 130', through exposed regions in the dielectric grid openings 120', to the remaining capping layer 132". The third etch removes regions of the etch stop layer 130' in the dielectric grid openings 120'. The process for performing the third etch may include, for example, applying an etchant 1102 to the etch stop layer 130'. The etchant 1102 may be selective of the etch stop layer 130' relative to the dielectric grid layer 128 and/or the remaining capping layer 132". Further, the etchant 1102 may be, for example, a wet etchant. In some embodiments, the third etch forms the etch stop layer 130' with vertical or substantially vertical sidewalls in the dielectric grid openings 120'.

Figure 12A:
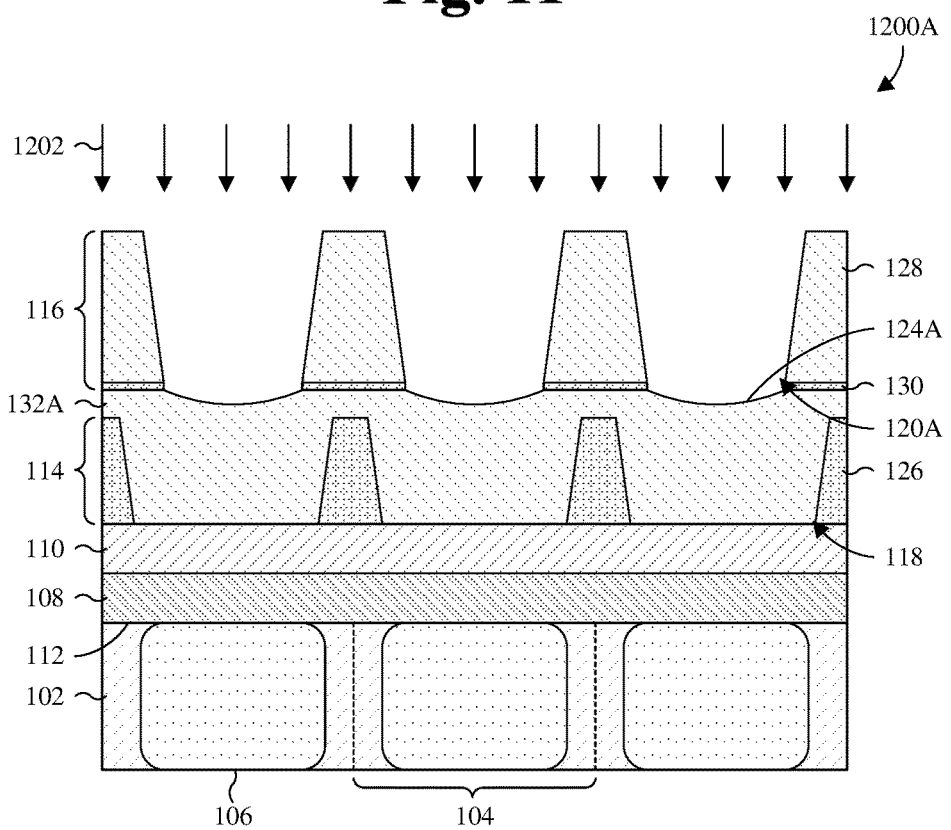

FIGS. 12A & B illustrate cross-sectional views 1200A, 1200B of some embodiments corresponding to Acts 418, 420, and 422. These embodiments are directed towards dielectric grid openings with concave lower surfaces.

As illustrated by FIG. 12A, a fourth etch is performed into the remaining capping layer 132", through exposed regions of the remaining capping layer 132", to form concave lower surfaces 124A for the remaining dielectric grid openings 120". The process for performing the fourth etch may include, for example, applying one or more etchants 1202 to the remaining capping layer 132" with etching parameters, such as etch rates, tuned to define the concave lower surfaces 124A. For example, the etching parameters may be tuned so the remaining capping layer 132" is etched faster at centers of the remaining dielectric grid openings 120" than at peripheries of the remaining dielectric grid openings 120". The one or more etchants 1202 may be selective of the remaining capping layer 132" relative to the remaining etch stop layer 130, and/or may be, for example, a wet or dry etchant. Since the one or more etchants 1202 are applied through the remaining dielectric grid openings 120", and the remaining dielectric grid layer 128 and the remaining capping layer 132" may be the same material, the one or more etchants 1202 may erode sidewalls of the remaining dielectric grid openings 120".

In alternative embodiments, the fourth etch may be replaced with another approach for forming the concave lower surfaces 124A. In some of such alternative embodiments, the concave lower surfaces 124A may be formed by a reflow process (e.g., a servo controlled reflow process). In others of such alternative embodiments, the concave lower surfaces 124A may be formed by a deposition with deposition parameters, such as deposition rates, tuned to define the concave lower surfaces 124A. For example, the deposition parameters may be tuned so the deposition rate is slower at centers of the remaining dielectric grid openings 120" than at peripheries of the remaining dielectric grid openings 120". Such a deposition may be construed as a second capping layer and/or an extension of the remaining capping layer 132".

Figure 12B:
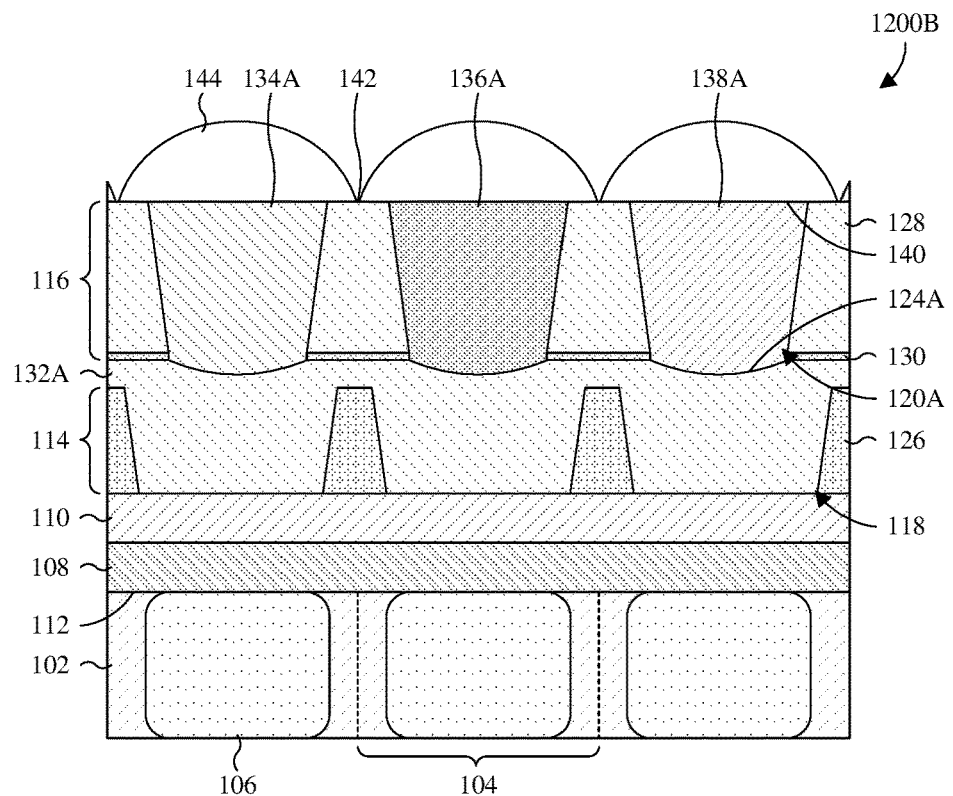

As illustrated by FIG. 12B, color filters 134A, 136A, 138A corresponding to the pixel sensors 104 are formed in the remaining dielectric grid openings 120A of the corresponding pixel sensors 104, typically with upper surfaces 140 approximately even with an upper surface 142 of the remaining dielectric grid layer 128. The color filters 134A, 136A, 138A are assigned corresponding colors or wavelengths of radiation (e.g., according to a Bayer filter mosaic), and formed of materials configured to transmit the assigned colors or wavelengths of radiation to the corresponding pixel sensors 104. Further, the color filters 134A, 136A, 138A are formed with materials having refractive indexes greater than the remaining capping layer 132A, and/or any other material abutting and underlying the concave lower surfaces 124A. The process for forming the color filters 134A, 136A, 138A may include, for each of the different color filter assignments, forming a color filter layer and patterning the color filter layer. The color filter layer may be formed so as to fill the remaining dielectric grid openings 120A and to cover the remaining dielectric grid layer 128. The color filter layer may then be planarized (e.g., by CMP) and/or etched back to about even with the upper surface 142 of the remaining dielectric grid layer 128, before patterning the color filter layer.

As also illustrated by FIG. 12B, micro lenses 144 corresponding to the pixel sensors 104 are formed over the color filters 134A, 136A, 138A of the corresponding pixel sensors 104. The process for forming the micro lenses 144 may include forming a micro lens layer above the color filters 134A, 136A, 138A (e.g., by a spin-on method or a deposition process). Further, a micro lens template having a curved upper surface may be patterned above the micro lens layer. The micro lens layer may then be selectively etched according to the micro lens template to form the micro lenses 144.

Figure 13A:
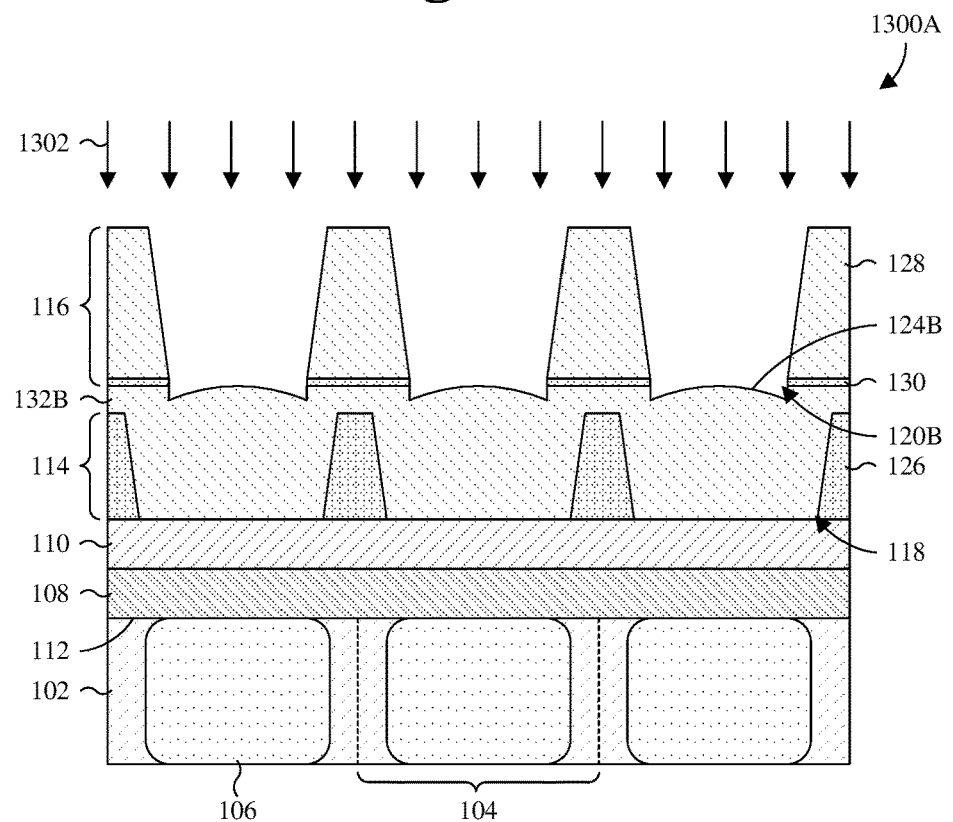

FIGS. 13A & B illustrate cross-sectional views 1300A, 1300B of other embodiments corresponding to Acts 418, 420, and 422. These embodiments are directed towards dielectric grid openings with convex lower surfaces.

As illustrated by FIG. 13A, a fourth etch is performed into the remaining capping layer 132", through exposed regions of the remaining capping layer 132", to form convex lower surfaces 124B for the remaining dielectric grid openings 120". The process for performing the fourth etch may include, for example, applying one or more etchants 1302 to the remaining capping layer 132" with etching parameters tuned to define the convex lower surfaces 124B. For example, the etching parameters may be tuned so the remaining capping layer 132" is etched faster at peripheries of the remaining dielectric grid openings 120" than at centers of the remaining dielectric grid openings 120". The one or more etchants 1302 may be selective of the remaining capping layer 132" relative to the remaining etch stop layer 130, and/or may be, for example, a wet or dry etchant.

In alternative embodiments, the fourth etch may be replaced with another approach for forming the convex lower surfaces 124B. In some of such alternative embodiments, the convex lower surfaces 124B may be formed by a reflow process. In others of such alternative embodiments, the convex lower surfaces 124B may be formed by a deposition with deposition parameters tuned to define the convex lower surfaces 124B. For example, the deposition parameters may be tuned so the deposition rate is slower at peripheries of the remaining dielectric grid openings 120" than at centers of the remaining dielectric grid openings 120". Such a deposition may be construed as a second capping layer and/or an extension of the remaining capping layer 132".

Figure 13B:
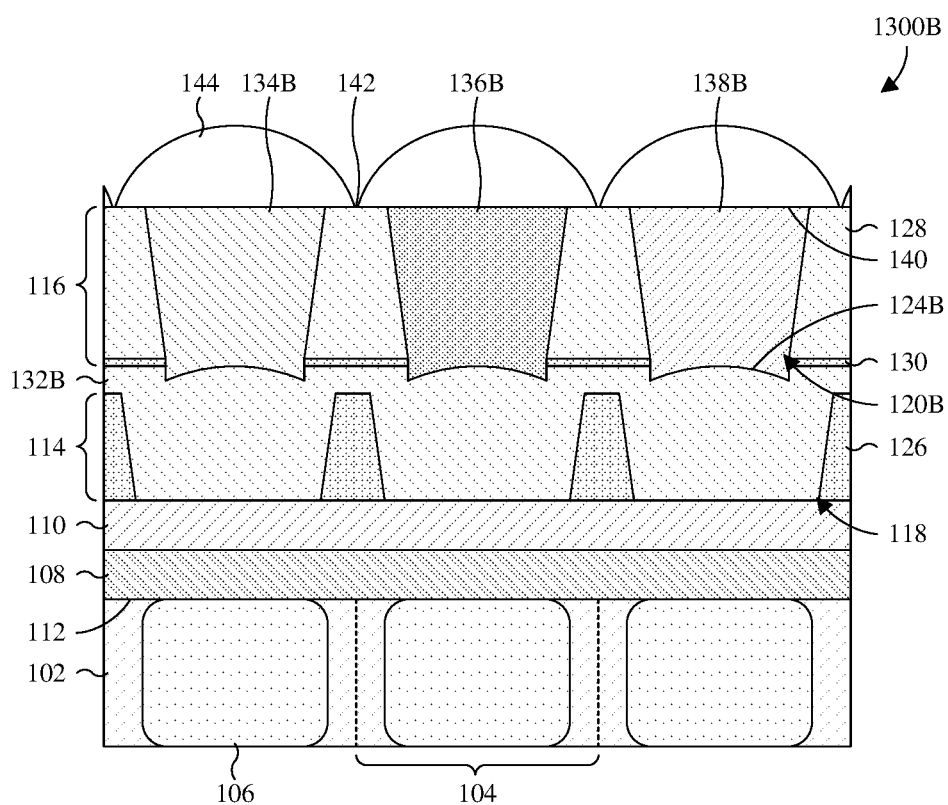

As illustrated by FIG. 13B, color filters 134B, 136B, 138B corresponding to the pixel sensors 104 are formed in the remaining dielectric grid openings 120A of the corresponding pixel sensors 104, typically with upper surfaces 140 approximately even with an upper surface 142 of the remaining dielectric grid layer 128. Further, the color filters 134B, 136B, 138B are formed with materials having refractive indexes less than the remaining capping layer 132B, and/or any other material abutting and underlying the convex lower surfaces 124B.

Also illustrated by FIG. 13B, micro lenses 144 corresponding to the pixel sensors 104 are formed over the color filters 134B, 136B, 138B, of the corresponding pixel sensors 104.

Thus, as can be appreciated from above, the present disclosure provides a back-side illuminated (BSI) image sensor including a pixel sensor arranged within a semiconductor substrate. A metallic grid segment is arranged over the pixel sensor, having a metallic grid opening therein, wherein the metallic grid segment has a metallic grid height. A dielectric grid segment is arranged over the metallic grid segment having a dielectric grid opening therein, wherein the dielectric grid segment has a dielectric grid height. A ratio of the dielectric grid height to the metallic grid height is between about 1.0 to about 8.0.

In other embodiments, the present disclosure provides a back-side illuminated (BSI) image sensor including a pixel sensor arranged within a semiconductor substrate. A metallic grid segment is arranged over the pixel sensor having a metallic grid opening therein. The metallic grid segment has a top metallic grid width and the metallic grid opening has a bottom metallic grid opening width. A dielectric grid segment is arranged over the metallic grid segment having a dielectric grid opening therein. The dielectric grid segment has a top dielectric grid width, wherein at least one of, a ratio of the top dielectric grid width to the top metallic grid width is between about 0.1 to about 2.0, and a ratio of the top dielectric grid width to the bottom metallic grid opening width is between about 0.1 to about 0.9.

In another embodiment, the present disclosure provides a back-side illuminated (BSI) image sensor including a pixel sensor arranged within a semiconductor substrate. A metallic grid segment is arranged over the pixel sensor having a metallic grid opening therein. The metal grid opening has a bottom metallic grid opening width. A dielectric grid segment is arranged over the metallic grid segment, having a dielectric grid opening therein. A stacked grid structure height extends from between the semiconductor substrate and the metallic grid segment to an upper surface of the dielectric grid segment. A ratio of the stacked grid structure height to the bottom metallic grid opening width is about 0.5 to about 2.0.

In yet other embodiments, the present disclosure provides a back-side illuminated (BSI) image sensor including a pixel sensor arranged within a semiconductor substrate. A metallic grid segment is arranged over the pixel sensor, having a metallic grid opening therein. A dielectric grid segment is arranged over the metallic grid segment, having a dielectric grid opening therein. An angle between a lower surface of the dielectric grid segment and a sidewall of the dielectric grid segment is about 60 degrees to about less than 90 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a semiconductor substrate;
   a pixel sensor in the semiconductor substrate;
   a metallic grid overlying the semiconductor substrate;
   an etch stop layer overlying the metallic grid;
   a dielectric layer over and directly contacting the etch stop layer at an interface, wherein the etch stop layer and the dielectric layer define a dielectric grid over the metallic grid; and
   a color filter overlying the pixel sensor and extending through the dielectric grid;
   wherein a width of the color filter has a first rate of change from a bottom of the color filter to an elevation level with the interface and further has a second rate of change from the elevation to a top of the color filter, and wherein the first rate is less than the second rate.

2. The image sensor according to claim 1, further comprising:
   a capping layer between the etch stop layer and the metallic grid, wherein the capping layer covers the metallic grid and has a protrusion protruding through the metallic grid, and wherein the protrusion underlies the color filter.

3. The image sensor according to claim 1, wherein the metallic grid has a pair of metallic grid segments that neighbor each other, and wherein the color filter overlies a center between the metallic grid segments.

4. The image sensor according to claim 1, wherein the color filter has a first sidewall facing the etch stop layer and a second sidewall facing the dielectric layer, and wherein an upward slope of the first sidewall is greater than that of the second sidewall.

5. The image sensor according to claim 4, wherein a bottom edge of the first sidewall is recessed relative to a bottom surface of the etch stop layer.

6. The image sensor according to claim 1, wherein the bottom of the color filter has a curved surface, and wherein edges of the curved surface are closer to the semiconductor substrate than a center of the curved surface.

7. The image sensor according to claim 1, wherein the color filter directly contacts the dielectric layer and the etch stop layer.

8. An image sensor comprising:
a semiconductor substrate;
a photodetector in the semiconductor substrate;
a metallic grid overlying the semiconductor substrate;
an etch stop layer overlying the metallic grid;
a dielectric layer overlying the etch stop layer, wherein the etch stop layer and the dielectric layer define a dielectric grid over the metallic grid; and
a color filter overlying the photodetector and extending through the dielectric grid;
wherein the etch stop layer and the dielectric layer respectively have a first sidewall and a second sidewall both bordering the color filter, and wherein a first angle between the first sidewall and a top surface of the semiconductor substrate is closer to 90 degrees than a second angle between the second sidewall and the top surface.

9. The image sensor according to claim 8, wherein the first and second sidewalls are arranged edge to edge.

10. The image sensor according to claim 8, wherein the color filter overhangs the first sidewall.

11. The image sensor according to claim 8, wherein the first and second sidewalls respectively border a third sidewall of the color filter and a fourth sidewall of the color filter, and wherein the third and fourth sidewalls respectively have the first and second angles relative to the top surface of the semiconductor substrate.

12. The image sensor according to claim 8, wherein the etch stop layer and the dielectric layer directly contact the color filter.

13. The image sensor according to claim 8, further comprising:
a capping layer between the etch stop layer and the metallic grid, wherein the capping layer extends through the metallic grid and has a third sidewall bordering the color filter, wherein a third angle between the third sidewall and the top surface of the semiconductor substrate is closer to 90 degrees than the second angle between the second sidewall and the top surface.

14. The image sensor according to claim 8, further comprising:
a capping layer between the etch stop layer and the metallic grid, wherein the capping layer covers the metallic grid and has a protrusion protruding through the metallic grid, wherein the protrusion has a third sidewall, and wherein the first angle between the first sidewall and the top surface of the semiconductor substrate is closer to 90 degrees than a third angle between the third sidewall and the top surface.

15. The image sensor according to claim 14, wherein the third sidewall directly contacts the metallic grid.

16. An image sensor comprising:
a semiconductor substrate;
a pixel sensor in the semiconductor substrate;
a metallic grid overlying the semiconductor substrate;
a dielectric grid over the metallic grid;
a capping layer between the dielectric and metallic grids, wherein the capping layer covers the metallic grid and protrudes through the metallic grid; and
a color filter overlying the pixel sensor and extending through the dielectric grid;
wherein the capping layer has a first sidewall bordering the color filter, wherein the dielectric grid has a second sidewall bordering the color filter, and wherein a smallest angle between the first sidewall and a top surface of the semiconductor substrate is greater than a smallest angle between the second sidewall and the top surface of the semiconductor substrate.

17. The image sensor according to claim 16, wherein a bottom edge of the second sidewall is directly over and spaced from a top edge of the first sidewall.

18. The image sensor according to claim 16, wherein the first and second sidewalls directly contact the color filter.

19. The image sensor according to claim 16, further comprising:
an etch stop layer having a third sidewall, wherein a smallest angle between the third sidewall and the top surface of the semiconductor substrate is a same as the smallest angle between the first sidewall and the top surface; and
a dielectric layer over the etch stop layer, wherein the etch stop layer and the dielectric layer form the dielectric grid, and wherein the dielectric layer forms the second sidewall.

20. The image sensor according to claim 16, wherein the capping layer has a curved surface arranged edge to edge with the first sidewall.

* * * * *